(12) United States Patent
Zhang et al.

(10) Patent No.: US 9,394,479 B2
(45) Date of Patent: *Jul. 19, 2016

(54) WAVELENGTH CONVERSION FILM HAVING PRESSURE SENSITIVE ADHESIVE LAYER TO ENHANCE SOLAR HARVESTING EFFICIENCY

(71) Applicant: NITTO DENKO CORPORATION, Osaka (JP)

(72) Inventors: Hongxi Zhang, Temecula, CA (US); Stanislaw Rachwal, Oceanside, CA (US); Jie Cai, Simi Valley, CA (US); Yufen Hu, San Diego, CA (US); Michiharu Yamamoto, Santa Clara, CA (US); Zongcheng Jiang, Oceanside, CA (US); Bogumila Rachwal, Oceanside, CA (US); Shuangxi Wang, Corona, CA (US); Peng Wang, San Diego, CA (US)

(73) Assignee: Nitto Denko Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/631,721

(22) Filed: Sep. 28, 2012

(65) Prior Publication Data

US 2013/0089946 A1 Apr. 11, 2013

Related U.S. Application Data

(60) Provisional application No. 61/543,744, filed on Oct. 5, 2011, provisional application No. 61/662,865, filed on Jun. 21, 2012.

(51) Int. Cl.
*C09J 7/02* (2006.01)
*B32B 27/00* (2006.01)
(Continued)

(52) U.S. Cl.
CPC . *C09K 11/06* (2013.01); *C09B 3/14* (2013.01); *C09B 57/00* (2013.01); *C09B 57/001* (2013.01); *C09B 57/008* (2013.01); *H01L 31/055* (2013.01); *H05B 33/14* (2013.01);
(Continued)

(58) Field of Classification Search
None
See application file for complete search history.

(56) References Cited

U.S. PATENT DOCUMENTS 3,239,406 A 3/1966 Coffman et al.
3,915,979 A 10/1975 Chow et al.
(Continued)

FOREIGN PATENT DOCUMENTS

CN 1 473 187 2/2004
CN 1 671 675 9/2005
(Continued)

OTHER PUBLICATIONS

Singh-Rachford et al., "Photon upconversion based on sensitized triplet-triplet annihilation," Coord. Chem. Rev. 254 (2010) 2560-2573.*
(Continued)

*Primary Examiner* — Ling Choi
*Assistant Examiner* — Catherine S Branch
(74) *Attorney, Agent, or Firm* — Vedder Price P.C.

(57) ABSTRACT

Described herein are wavelength conversion films that are easy-to-apply to solar cells, solar panels, or photovoltaic devices using an adhesive layer. The wavelength conversion films include a wavelength conversion layer with a photostable chromophore and are useful for improving the solar harvesting efficiency of solar cells, solar panels, and photovoltaic devices.

25 Claims, 4 Drawing Sheets

(51) Int. Cl.

| | | |
|---|---|---|
| *B32B 5/00* | (2006.01) | |
| *H01L 31/18* | (2006.01) | |
| *C09J 175/04* | (2006.01) | |
| *C09J 133/08* | (2006.01) | |
| *B32B 33/00* | (2006.01) | |
| *B32B 37/16* | (2006.01) | |
| *C09J 131/04* | (2006.01) | |
| *C09K 11/06* | (2006.01) | |
| *C09B 3/14* | (2006.01) | |
| *H01L 31/055* | (2014.01) | |
| *H05B 33/14* | (2006.01) | |
| *C09B 57/00* | (2006.01) | |

(52) U.S. Cl.
CPC . *C09K2211/1011* (2013.01); *C09K 2211/1059* (2013.01); *C09K 2211/1466* (2013.01); *Y02E 10/52* (2013.01); *Y10T 156/10* (2015.01); *Y10T 428/1476* (2015.01); *Y10T 428/263* (2015.01); *Y10T 428/269* (2015.01); *Y10T 428/28* (2015.01); *Y10T 428/2848* (2015.01); *Y10T 428/2891* (2015.01); *Y10T 428/2896* (2015.01)

(56) References Cited

U.S. PATENT DOCUMENTS

| | | | |
|---|---|---|---|
| 4,162,928 A | 7/1979 | Shepard, Jr. | |
| 4,262,851 A | 4/1981 | Graser et al. | |
| 4,297,490 A | 10/1981 | Neumann | |
| 4,379,934 A | 4/1983 | Graser et al. | |
| 4,419,427 A | 12/1983 | Graser et al. | |
| 4,431,808 A | 2/1984 | Protiva et al. | |
| 4,446,324 A | 5/1984 | Graser | |
| 4,450,273 A | 5/1984 | Graser | |
| 4,501,906 A | 2/1985 | Spietschka et al. | |
| 4,594,420 A | 6/1986 | Spietschka et al. | |
| 4,618,694 A | 10/1986 | Iden et al. | |
| 4,667,036 A | 5/1987 | Iden et al. | |
| 4,709,029 A | 11/1987 | Spietschka et al. | |
| 4,725,690 A | 2/1988 | Graser | |
| 4,746,741 A | 5/1988 | Staudenmayer et al. | |
| 4,831,140 A | 5/1989 | Spietschka et al. | |
| 4,845,223 A | 7/1989 | Seybold et al. | |
| 4,968,571 A | 11/1990 | Gruenbaum et al. | |
| 5,019,473 A | 5/1991 | Nguyen et al. | |
| 5,028,504 A | 7/1991 | Rule et al. | |
| 5,077,161 A | 12/1991 | Law | |
| 5,123,966 A | 6/1992 | Dietz et al. | |
| 5,141,837 A | 8/1992 | Nguyen et al. | |
| 5,154,770 A | 10/1992 | Spietschka et al. | |
| 5,248,774 A | 9/1993 | Dietz et al. | |
| 5,264,034 A | 11/1993 | Dietz et al. | |
| 5,466,807 A | 11/1995 | Dietz et al. | |
| 5,472,494 A | 12/1995 | Hetzenegger et al. | |
| 5,645,965 A | 7/1997 | Duff et al. | |
| 5,693,808 A | 12/1997 | Langhals | |
| 5,710,197 A | 1/1998 | Fischer et al. | |
| 5,808,073 A | 9/1998 | Böhm et al. | |
| 5,816,238 A | 10/1998 | Burns et al. | |
| 5,874,580 A | 2/1999 | Hao et al. | |
| 5,981,773 A | 11/1999 | Langhals et al. | |
| 6,063,181 A | 5/2000 | Böhm et al. | |
| 6,130,217 A | 10/2000 | Arnold et al. | |
| 6,136,976 A | 10/2000 | Boehm et al. | |
| 6,139,210 A | 10/2000 | Nelson et al. | |
| 6,166,210 A | 12/2000 | Langhals et al. | |
| 6,184,378 B1 | 2/2001 | Böhm et al. | |
| 6,326,494 B1 | 12/2001 | Böhm et al. | |
| 6,572,977 B1 | 6/2003 | Pavelka et al. | |
| 6,654,161 B2 | 11/2003 | Bass et al. | |
| 6,806,368 B2 | 10/2004 | Würthner et al. | |
| 6,924,427 B2 | 8/2005 | Eckert et al. | |
| 6,986,811 B2 | 1/2006 | Könemann et al. | |
| 7,714,099 B2 | 5/2010 | Morishita et al. | |
| 7,791,157 B2 | 9/2010 | Cho et al. | |
| 7,867,601 B2 | 1/2011 | Ikishima et al. | |
| 7,887,914 B2 | 2/2011 | Kobayashi et al. | |
| 7,943,845 B2 | 5/2011 | Hayes | |
| 8,158,450 B1 | 4/2012 | Sheats et al. | |
| 2004/0092246 A1 | 5/2004 | Cai et al. | |
| 2004/0115473 A1 | 6/2004 | Burroughes et al. | |
| 2005/0271566 A1 | 12/2005 | Yadav | |
| 2006/0041221 A1 | 2/2006 | Stypulkowski | |
| 2006/0052612 A1 | 3/2006 | Stossel et al. | |
| 2006/0083945 A1 | 4/2006 | Morishita et al. | |
| 2007/0003783 A1 | 1/2007 | Morishita et al. | |
| 2007/0073052 A1 | 3/2007 | Velusamy et al. | |
| 2008/0087878 A1 | 4/2008 | Koenemann et al. | |
| 2008/0114170 A1 | 5/2008 | Koenemann et al. | |
| 2008/0149165 A1 | 6/2008 | Hoeks et al. | |
| 2008/0167345 A1 | 7/2008 | Jones et al. | |
| 2008/0236667 A1 | 10/2008 | Naum et al. | |
| 2008/0245411 A1 | 10/2008 | Hammermann et al. | |
| 2008/0289681 A1* | 11/2008 | Adriani et al. | 136/251 |
| 2009/0124625 A1 | 5/2009 | Bessis et al. | |
| 2009/0151785 A1 | 6/2009 | Naum et al. | |
| 2009/0275619 A1 | 11/2009 | Boueres et al. | |
| 2010/0012183 A1 | 1/2010 | Yeh | |
| 2010/0043875 A1 | 2/2010 | Bhaumik et al. | |
| 2010/0139769 A1 | 6/2010 | Mapel | |
| 2010/0154862 A1 | 6/2010 | Schiavoni et al. | |
| 2010/0186801 A1 | 7/2010 | Boehm et al. | |
| 2010/0224248 A1 | 9/2010 | Kenney et al. | |
| 2010/0249367 A1 | 9/2010 | Toppare et al. | |
| 2010/0278480 A1 | 11/2010 | Vasylyev | |
| 2010/0294339 A1 | 11/2010 | Hollars | |
| 2011/0011455 A1 | 1/2011 | Ji et al. | |
| 2011/0204292 A1 | 8/2011 | Imamura | |
| 2011/0253197 A1* | 10/2011 | Mapel et al. | 136/247 |
| 2012/0222723 A1 | 9/2012 | Mayer et al. | |
| 2012/0227809 A1* | 9/2012 | Bharti et al. | 136/259 |
| 2013/0074927 A1* | 3/2013 | Rachwal et al. | 136/257 |
| 2013/0089946 A1 | 4/2013 | Zhang et al. | |
| 2013/0139868 A1 | 6/2013 | Zhang et al. | |
| 2013/0284265 A1 | 10/2013 | Jiang et al. | |
| 2014/0083482 A1* | 3/2014 | Hebrink | 136/246 |
| 2014/0311566 A1 | 10/2014 | Zhang et al. | |
| 2015/0041042 A1 | 2/2015 | Zhang et al. | |
| 2015/0041052 A1 | 2/2015 | Zhang et al. | |

FOREIGN PATENT DOCUMENTS

| | | |
|---|---|---|
| CN | 101 148 495 | 3/2008 |
| CN | 101 289 447 | 10/2008 |
| CN | 101 343 352 | 1/2009 |
| CN | 101 671 428 | 3/2010 |
| CN | 101 768 138 | 7/2010 |
| CN | 101 775 123 | 7/2010 |
| CN | 101 935 389 | 1/2011 |
| CN | 102 464 794 | 5/2012 |
| DE | 28 51 513 | 6/1980 |
| DE | 34 00 991 | 7/1985 |
| DE | 10 2005 062 687 | 7/2007 |
| EP | 0284686 A1 | 2/1987 |
| EP | 0 692 517 | 1/1996 |
| EP | 2 080 785 | 7/2009 |
| EP | 2 194 106 | 6/2010 |
| EP | 2 261 300 | 12/2010 |
| EP | 2 333 017 | 6/2011 |
| EP | 2 354 204 | 8/2011 |
| EP | 2 355 162 | 8/2011 |
| EP | 2 557 137 | 2/2013 |
| EP | 2 557 606 | 2/2013 |
| EP | 2 578 075 | 4/2013 |
| FR | 2146136 | 2/1973 |
| JP | 44-008884 | 4/1969 |
| JP | 50-159483 | 12/1975 |
| JP | 53-90260 | 8/1978 |
| JP | 1-135776 | 5/1989 |
| JP | 11-220147 | 8/1999 |
| JP | 2001-000410 | 1/2001 |
| JP | 2001-094129 | 4/2001 |
| JP | 2005-258388 | 9/2005 |

(56) References Cited

FOREIGN PATENT DOCUMENTS

| | | |
|---|---|---|
| JP | 2006-077171 | 3/2006 |
| JP | 2008-502674 | 1/2008 |
| JP | 2008-516008 | 5/2008 |
| JP | 2009-532452 | 9/2009 |
| JP | 2010-283282 | 12/2010 |
| JP | 2011-151094 | 8/2011 |
| JP | 2012-077116 | 4/2012 |
| WO | WO 02/22761 | 3/2002 |
| WO | WO 2004/092246 | 10/2004 |
| WO | WO 2005/054212 | 6/2005 |
| WO | WO 2006/041221 | 4/2006 |
| WO | WO 2006/088369 | 8/2006 |
| WO | WO 2008/110567 | 9/2008 |
| WO | WO 2009/011791 | 1/2009 |
| WO | WO 2009/115574 | 9/2009 |
| WO | WO 2010/046114 | 4/2010 |
| WO | 2010084067 A2 | 7/2010 |
| WO | WO 2010/114497 | 10/2010 |
| WO | WO 2010/118920 | 10/2010 |
| WO | WO 2011/068305 | 6/2011 |
| WO | WO 2011/072876 | 6/2011 |
| WO | 2011073316 A1 | 7/2011 |
| WO | WO 2012/024070 | 2/2012 |
| WO | WO 2012-043401 | 4/2012 |
| WO | WO 2012/068703 | 5/2012 |
| WO | WO 2012/094409 | 7/2012 |
| WO | WO 2012/134992 | 10/2012 |
| WO | WO 2013/049062 | 4/2013 |
| WO | WO 2013/052381 | 4/2013 |
| WO | WO 2013/067288 | 5/2013 |
| WO | WO 2013/085607 | 6/2013 |
| WO | WO 2013/116559 | 8/2013 |
| WO | WO 2013/116569 | 8/2013 |
| WO | 2013128465 A1 | 9/2013 |
| WO | WO 2014/160707 | 10/2014 |
| WO | WO 2014-197393 | 12/2014 |

OTHER PUBLICATIONS

Dupont Teflon Films for Photovoltaic Modules (Dec. 2006).*
Krebs et al., "Product integration of compact roll-to-roll process polymer solar cell modules: methods and manufacture using flexographic printing, slot-die coating and rotary screen printing," J. Mater. Chem., 2010, 20, 8994-9001.*
U.S. Appl. No. 61/430,053, filed Jan. 5, 2011, Nitto Denko Corp.
U.S. Appl. No. 61/485,093, filed May 11, 2011, Wang et al.
U.S. Appl. No. 61/539,392, filed Sep. 26, 2011, Rachwal et al.
Balan et al., "Electrochromic Device and Bulk Heterojunction Solar Cell Applications of Poly 4,7-bis(2,3-dihydrothieno[3,4-b][1,4]dioxin-5-yl)-2-dodecyl-2H-benzo[1,2,3]triazole (PBEBT)", Solar Energy Materials & Solar Cells, 2010, vol. 94, pp. 1797-1802.
Balan et al., "One Polymer for All: Benzotriazole Containing Donor-Acceptor Type Polymer as a Multi-Purpose Material", Chemical Communications, 2009, vol. 44, pp. 6768-6770.
Baran et al., "Processable Multipurpose Conjugated Polymer for Electrochromic and Photovoltaic Applications", Chemistry of Materials, 2010, vol. 22, pp. 2978-2987.
Baran et al., "Spectroelectrochemical and Photovoltaic Characterization of a Solution-Processable n-and-p Type Dopable Pyrrole-Bearing Conjugated Polymer", Macromolecular Chemistry and Physics, 2010, vol. 211, No. 24, pp. 2602-2610.
Bulut et al., "Benzotriazole Derivatives as Long Wavelength Photosensitizers for Diaryliodonium Salt Initiators", Journal of Polymer Science Part A: Polymer Chemistry, 2010, vol. 49, No. 3, pp. 729-733.
Cui et al., "Incorporating Benzotriazole Moiety to Construct D-A-Π-A Organic Sensitizers for Solar Cells: Significant Enhancement of Open-Circuit Photovoltage with Long Alkyl Group", Chemistry of Materials, 2011, vol. 23, No. 19, pp. 4394-4401.
Falzon et al., "Designing Acceptor Polymers for Organic Photovoltaic Devices", The Journal of Physical Chemistry, 2011, vol. 115, No. 7, pp. 3178-3187.
Lin et al., "High Photoelectric Conversion Efficiency of Metal Phthalocyanine/Fullerene Heterojunction Photovoltaic Device", International Journal of Molecular Sciences, 2011, vol. 12, pp. 476-505.
Liu et al., "A Dithienyl Benzotriazole-based Polyfluorene:Synthesis and Applications in Polymer Solar Cells and Red Light-Emitting Diodes", Macromolecular Chemistry and Physics, 2011, vol. 212, No. 14, pp. 1489-1496.
Min et al., "Synthesis and Photovoltaic Properties of D-A Copolymers Based on Dithienosilole and Benzotriazole", Macromolecules, 2011, vol. 44, No. 19, pp. 7632-7638.
Peng et al., "A New Dithienylbenzotriazole-Based Poly(2,7-carbazole) for Efficient Photovoltaics", Macromolecular Chemistry and Physics, 2010, vol. 211, No. 18, pp. 2026-2033.
Price et al., "Fluorine Substituted Conjugated Polymer of Medium Band Gap Yields 7% Efficiency in Polymer-Fullerene Solar Cells", Journal of the American Chemical Society, 2011, vol. 133, No. 12, pp. 4625-4631.
Xu et al., "Conjugated Polymers for Optoelectronic Applications", Macromolecular Symposia, 2008, pp. 161-170.
Zhang et al., "Bulk-Heterojunction Solar Cells with Benzotriazole-Based Copolymers as Electron Donors: Largely Improved Photovoltaic Parameters by Using PFN/A1 Bilayer Cathode", Macromolecules, 2010, vol. 43, pp. 9771-9778.
Zhang et al., "Copolymers from Benzodithiophene and Benzotriazole: Synthesis and Photovoltaic Applications", Polymer Chemistry, 2010, vol. 1, No. 9, pp. 1441-1447.
Zhang et al., "Synthesis and Photovoltaic Properties of Dithienyl Benzotriazole Based Poly(phenylene vinylene)s", Journal of Applied Polymer Science, 2011, vol. 120, pp. 2534-2542.
Hasobe et al., "Hierarchical Assembly of Porphyrins and Fullerenes for Solar Cells," The Electrochemical Society Interface, Summer 2006, pp. 47-51.
Pasker et al., "Thiophene-2-aryl-2H-benzotriazole-thiophene Oligomers with Adjustable Electronic Properties," Organic Letters, 2011, vol. 13, No. 9, pp. 2338-2341.
"Tedlar® Polyvinyl Fluoride Film," Du Pont—Product and Performance Guide, Dec. 1995, pp. 6.
Invitation to Pay Additional Fees in PCT Application No. PCT/US2012/058062 dated Apr. 22, 2013.
International Search Report and Written Opinion in PCT Application No. PCT/US2012/058062 dated Jun. 12, 2013.
International Preliminary Report on Patentability and Written Opinion in PCT Application No. PCT/US2012/058062 dated Apr. 2014.
Mao et al., "Benzotriazole-Bridged Sensitizers Containing a Furan Moiety for Dye-Sensitized Solar Cells with High Open-Circuit Voltage Performance," Chemistry Asian Journal, 2012, pp. 982-991.
Pasker et al., "Photovoltaic Response to Structural Modifications on a Series of Conjugated Polymers Based on 2-Aryl-2H-Benzotriazoles," Polymer Chemistry, 2011, vol. 49, No. 23, pp. 5001-5011.
Yuan et al., "Efficient Synthesis of Regioisomerically Pure Bis(trufluoronnethyl)-Substituted 3,4,9,10-Perylene Tetacarboxylic Bis(Benzimidazole)", Organic Letters, 2009, vol. 11, No. 13, pp. 2808-2811.
Zhu et al., "Organic D-A-Π-A Solar Cell Sensitizers with Improved Stability and Spectral Response", Advanced Functional Materials, 2011, vol. 21, pp. 756-763.
Akbaş oğlu et al., "Electrochemical and Optical Studies of Furan and Thieno[3,2-B]Thiophene End Capped Benzotriazole Derivatives," Journal of Polymer Science Part A: Polymer Chemistry, Dec. 1, 2010, vol. 48, No. 23, pp. 5603-5610.
Balan et al., "Donor-Acceptor Polymer with Benzotriazole Moiety: Enhancing the Electrochomic Properties of the 'Donor Unit,'" Chemistry of Materials, 2008, vol. 20, No. 24, pp. 7510-7513.
Celebi et al., "Enhancing Electrochromic and Kinetic Properties of poly(2,3-bis(4-tert-butyphenyl)-5,8-di(1H-pyrrol-2-yl) quinoxaline) by Copolymerization," Electrochimica Acta, Feb. 28, 2010, vol. 55, No. 7, pp. 2373-2376.
çetin et al., "A New p- and n-Dopable Selenophene Derivative and its Electrochromic Properties," Organic Electronics, Feb. 2009, vol. 10, No. 1, pp. 34-41.

(56) References Cited

OTHER PUBLICATIONS

Currie et al., "High-Efficiency Organic Solar Concentrators for Photovoltaics," Science, 2008, vol. 321, pp. 226.
Ekiz et al., "Electrochemical Polymerization of (2-Dodecyl-4,7-di(thiophen-2-yl)-2H-benzo[d][1,2,3]triazole): A Novel Matrix for Biomolecule Immobilization," Macromolecular Bioscience, Dec. 8, 2010, vol. 10, No. 12, pp. 1557-1565.
Glaeser et al., "Improvement of Photon Collection in Cu(In,Ga)Se2 Solar Cells and Modules by Fluorescent Frequency Conversion," Thin Solid Films, 2007, vol. 515, pp. 5964-5967.
Hizalan et al., "Spray Processable Ambipolar Benzotriazole Bearing Electrochromic Polymers with Multi-Colored and Transmissive States," Journal of Materials Chemistry, 2011, vol. 21, No. 6, pp. 1804-1809.
Hong et al., "Organic Dye-Doped Thin Films for Wavelength Conversion and Their Effects on the Photovoltaic Characteristics of CdS/CdTe Solar Cell," Japan Journal of Applied Physics, 2004, vol. 43, pp. 1421-1426.
Hu et al., "Theoretical Investigation on the White-Light Emission from a Single-Polymer System with Simultaneous Blue and Orange Emission" Polymer, Nov. 2009, vol. 50, No. 25, pp. 6172-6185.
Hu et al., "Theoretical Investigation on the White-Light Emission from a Single-Polymer System with Simultaneous Blue and Orange Emission (Part II)," European Polymer Journal, Feb. 2011, vol. 47, No. 2, pp. 208-224.
Içli et al., "Donor-Acceptor Polymer Electrochromes with Tunable Colors and Performance," Chemistry of Materials, 2010, vol. 22, No. 13, pp. 4034-4044.
Ishi-i et al., "Fluorescent Two-photon Absorption Benzothiadiazole Dyes Having Photoreleasing Quenchers," Chemistry Letters, 2009, vol. 38, No. 11, pp. 1042-1043.
Jones et al., "Tuning Orbital Energentics in Arylene Diimide Semiconductors. Materials Design for Ambient Stability of n-Type Charge Transport," Journal of American Chemical Society, 2007, vol. 129, pp. 15259-15278.
Karakus et al., "Electrochemical and Optical Properties of Solution Processable Benzotriazole and Benzothiadiazole Containing Copolymers," Synthetic Metals, Feb. 2012, vol. 162, No. 1-2, pp. 79-84.
Kato et al., "Novel 2,1,3-Benzothiadiazole-Based Red-fluorescent Dyes with Enhanced Two-photon Absorption Cross-Sections," Chemistry—A European Journal, Mar. 1, 2006, vol. 12, No. 8, pp. 2303-2317.
Kato et al., "Strongly red-fluorescent novel donor-π-bridge-acceptor-π-bridge-donor (D-π-A-π-D) type 2,1,3-benzothiadiazoles with enhanced two-photon absorption cross-sections," Chemical Communications, 2004, vol. 20, pp. 2342-2343.
Kaya et al., "Electrochromic and Optical Studies of Solution Processable Benzotriazole and Fluorene Containing Copolymers," Organic Electronics, vol. 12, No. 1, Jan. 2011, pp. 202-209.
Kaya et al., "Solution Processable Benzotriazole and Fluorene Containing Copolymers for Photovoltaic Applications," Solar Energy Materials and Solar Cells, Apr. 2012, vol. 91, pp. 321-326.
Klampaftis et al., "Enhancing the Performance of Solar Cells via Luminescent Down-shifting of the Incident Spectrum: A Review," Materials and Solar Cells, 2009, vol. 93, pp. 1182-1194.
Lui et al., "White Electroluminescene from a Star-like Polymer with an Orange Emissive Core and Four Blue Emissive Arms," Advanced Materials, 2008, vol. 20, No. 7, pp. 1357-1362.
Lui et al., "Synthesis and Electroluminescent Properties of a Phenothiazine-Based Polymer for Nondoped Polymer Light-Emitting Diodes with a Stable Orange-Red Emission," Journal of Polymer Science Part A: Polymer Chemistry, Nov. 1, 2007, vol. 45, No. 21, pp. 4867-4878.
Lui et al., "Synthesis and Photovoltaic Properties of a Solution-Processable Organic Molecule Containing Dithienylbenzotriazole and Triphenylamine," Synthetic Metals, May 2012, vol. 162, No. 7-8, pp. 630-635.

Maruyama et al., "Transformations of the Wavelength of the Light Incident Upon Solar Cells," Solar Energy Materials and Solar Cells, 2001, vol. 69, pp. 207.
Mikroyannidis et al., "Synthesis of Benzoselenadiazole-Based Small Molecule and Phenylenevinylene Copolymer and their Application for Efficient Bulk Heterojunction Solar Cells," Organic Electronics, Feb. 2010, vol. 11, No. 2, pp. 311-321.
Muffler et al., "Colloid Attachment by ILGAR-layers: Creating Fluorescing Layers to Increase Quantum Efficiency of Solar Cells," Solar Energy Materials and Solar Cells, 2006, vol. 90, pp. 3143-3150.
Richards et al., "Overcoming the Poor Short Wavelength Spectral Response of CdS/CdTe Photovoltaic Modules via Luminescence Down-Shifting: Ray-Tracing Simulations," Progress in Photovoltaics: Research and Applications, 2007, vol. 15, pp. 27-34.
Shigeiwa et al., "Two-photon Absorption and Fluorescence Properties of Benzothiadiazole Dyes," Nonlinear Optics, Quantum Optics, 2005, vol. 34, No. 1-4, pp. 171-174.
Tanimoto et al., "Synthesis of n-Type(benzotriazole)s having p-Conducting and Polymerizable Carbazole Pendants," Macromolecules, 2006, vol. 39, pp. 3546-3552.
Thomas et al., "Color Tuning in Benzo[1,2,5]thiadiazole-Based Small Molecules by Amino Conjugation/Deconjugation: Bright Red-Light-Emitting Diodes," Advanced Functional Materials, Jan. 2004, vol. 14, No. 1, pp. 83-90.
Velusamy et al., "Benzo[1,2,5]Selenadiazole Bridged Amines: Electro-Optical Properties," Tetrahedron Letters, Oct. 2005, vol. 46, No. 44, pp. 7647-7651.
Velusamy et al., "Organic Dyes Incorporating Low-band-gap Chromophores for Dye-Sensitized Solar Cells," Organic Letters, 2005, vol. 7, No. 10, pp. 1899-1902.
Yang et al., "Theoretical Study of One-photon and Two-photon Absorption Properties for 2,1,3-Benzothiadiazole-based Red-fluorescent Dyes," Journal of Molecular Structure: THEOCHEM, vol. 848, No. 1-3, Jan. 15, 2008, pp. 24-33.
Yasuda et al., "Benzothiadiazole-Triphenylamine Derivatives as Donor Materials for Bulk-Heterojunction Organic Solar Cells," Journal of Photopolymer Science and Technology, 2010, vol. 23, No. 3, pp. 307-312.
Yigitsoy et al., "Benzyl Substituted Benzotriazole Containing Conjugated Polymers: Effect of Position of the Substituent on Electrochromic Properties," Synthetic Metals, vol. 160, No. 23-24, Dec. 2010, pp. 2534-2539.
Yigitsoy et al., "Multichromic Polymers of Benzotriazole Derivates: Effect of Benzul Substitution," Electrochimica Acta, 2011, vol. 56, No. 5, pp. 2263-2268.
Zhang et al., "Synthesis and Photovoltaic Property of Alternating Copolymer Derived from 2,7-Carbazole and 4,7-Bis(2'-Thienyl)-2-Dodecyl-2,1,3-Benzotriazole," Polymer Preprints, 2011, vol. 52, No. 2, pp. 1000-1001.
Zhang et al., "Synthesis and Characterization of Perylene Tetracarboxylic Bisester Monoimide Derivatives," Dyes and Pigments Journal, 2008, vol. 76, pp. 810-816.
International Search Report and Written Opinion in PCT Application No. PCT/US2012/057118, dated Apr. 22, 2013, 23 pages.
International Search Report and Written Opinion in PCT Application No. PCT/US2013/024225, dated May 7, 2013, 12 pages.
International Search Report and Written Opinion in PCT Application No. PCT/US2013/024212, dated Apr. 23, 2013, 15 pages.
International Search Report and Written Opinion in PCT Application No. PCT/US2012/053218, dated Apr. 22, 2013, 16 pages.
International Search Report and Written Opinion in PCT Application No. PCT/US2012/020209, dated Jul. 17, 2012, 14 pages.
First Office Action and English Translation in corresponding Chinese Appl. No. 201280001373.X mailed on Jul. 17, 2014, 32 pages.
Indian Journal of Pure and Applied Physics, vol. 33, pp. 169-178, (1995).
Japanese Office Action and Translation dated Feb. 28, 2015, which issued during prosecution of Japanese Application No. 2013-266062.
Fu, et al. Functional Polymers LII** Synthesis and Polycondensation of 2(2,4,-Dihydroxyphenyl)2H-1,3-bis(4-carboxy (or 4-carbomethoxyy)2H-benzotriazole), Monatshefte fuer Chemie, 1988, 119:1200-1309.

(56) References Cited

OTHER PUBLICATIONS

Murugesan, et al. "Synthesis and characterizations of benzotriazole based donor-acceptor copolymers for organic photovoltaic applications" Synthetic Metals, 2012, 162:1037-1045.

Kamel, et al. "Studies on Some Benzotriazole Derivatives" Tetrahedron, 1964, 20:211-214.

Milata, et al. "4-Aminoethylene Derivatives of 2-Methylbenzotriazole" Collection of Czechoslovak Chemical Communications, 1990, 55(4)1038-1048.

Canada, et al. "On the Possibility of Chlorotropy in Aromatic Azoles: The Case of 1,2, 3-Triazoles and Benzotriazoles" Heterocycles, 1985, 23(9):2225-2228.

Sanna, et al. "1,2,3-Triazolo[4,5-H]Quinolines. III. Preparation and Antimicrobial Evaluation of 4-Ethyl 4,7, Dihydro 1(2)-R-1(2)H Triazolo [4,5-H] Quinolin 7 One (Carboxylic Acis As Anti Infectives of the Urinary Tract" IL Farmaco, 1992, 47(7,8):1001-1019.

Katritzky, et al. "Influence of Structure on the Isomerization of Dialkylaminoalkylbenzotriazoles" Journal of Physical Organic Chemistry, 1990, 3:(5)289-294.

Katritzky, Perumal, et al. "An NMR Study of the Equilibria Involved with Benzotriazole, Carbonyl Compounds, and their Adducts" Journal of the Chemical Society, Perkin Transactions 2: Physical Organic Chemistry, 1990, 6:921-924.

Taiwan Office Action and Translation dated Jan. 20, 2016, which issued during prosecution of Taiwan Application No. 10520064870.

\* cited by examiner

WAVELENGTH CONVERSION FILM HAVING PRESSURE SENSITIVE ADHESIVE LAYER TO ENHANCE SOLAR HARVESTING EFFICIENCY

CROSS-REFERENCE TO RELATED APPLICATIONS

This patent application claims the benefit of priority to U.S. Provisional Patent Application No. 61/543,744, filed Oct. 5, 2011, and U.S. Provisional Patent Application No. 61/662,865, filed Jun. 21, 2012. All of the foregoing applications are fully incorporated herein by reference for all purposes.

BACKGROUND OF THE INVENTION

1. Field of the Invention

The present invention generally relates to wavelength conversion films that are easy-to-apply to solar cells, solar panels, or photovoltaic devices using an adhesive layer. The wavelength conversion can be used to improve the solar harvesting efficiency of these types of devices.

2. Description of the Related Art

The utilization of solar energy offers a promising alternative energy source to the traditional fossil fuels, and therefore, the development of devices that can convert solar energy into electricity, such as photovoltaic devices (also known as solar cells), has drawn significant attention in recent years. Several different types of mature photovoltaic devices have been developed, including a Silicon based device, a III-V and II-VI PN junction device, a Copper-Indium-Gallium-Selenium (CIGS) thin film device, an organic sensitizer device, an organic thin film device, and a Cadmium Sulfide/Cadmium Telluride (CdS/CdTe) thin film device, to name a few. More detail on these devices can be found in the literature, such as Lin et al., "High Photoelectric Conversion Efficiency of Metal Phthalocyanine/Fullerene Heterojunction Photovoltaic Device" (International Journal of Molecular Sciences 2011). However, the photoelectric conversion efficiency of many of these devices still has room for improvement and development of techniques to improve this efficiency has been an ongoing challenge for many researchers.

Recently, one technique developed to improve the efficiency of photovoltaic devices is to utilize a wavelength down-shifting film. Many of the photovoltaic devices are unable to effectively utilize the entire spectrum of light as the materials on the device absorb certain wavelengths of light (typically the shorter UV wavelengths) instead of allowing the light to pass through to the photoconductive material layer where it is converted into electricity. Application of a wavelength down-shifting film absorbs the shorter wavelength photons and re-emits them at more favorable longer wavelengths, which can then be absorbed by the photoconductive layer in the device, and converted into electricity.

This phenomenon is often observed in the thin film CdS/CdTe and CIGS solar cells which both use CdS as the window layer. The low cost and high efficiency of these thin film solar cells has drawn significant attention in recent years, with typical commercial cells having photoelectric conversion efficiencies of 10-16%. However, one issue with these devices is the energy gap of CdS, approximately 2.41 eV, which causes light at wavelengths below 514 nm to be absorbed by CdS instead of passing through to the photoconductive layer where it can be converted into energy. This inability to utilize the entire spectrum of light effectively reduces the overall photoelectric conversion efficiency of the device.

There have been numerous reports disclosing the utilization of a wavelength down-shifting material to improve the performance of photovoltaic devices. For example, U.S. Patent Application Publication No. 2009/0151785 discloses a silicon based solar cell which contains a wavelength down-shifting inorganic phosphor material. U.S. Patent Application Publication No. US 2011/0011455 discloses an integrated solar cell comprising a plasmonic layer, a wavelength conversion layer, and a photovoltaic layer. U.S. Pat. No. 7,791,157 discloses a solar cell with a wavelength conversion layer containing a quantum dot compound. U.S. Patent Application Publication No. 2010/0294339 discloses an integrated photovoltaic device containing a luminescent down-shifting material, however no example embodiments were constructed. U.S. Patent Application Publication. No. 2010/0012183 discloses a thin film solar cell with a wavelength down-shifting photo-luminescent medium; however, no examples are provided. U.S. Patent Application Publication No. 2008/0236667 discloses an enhanced spectrum conversion film made in the form of a thin film polymer comprising an inorganic fluorescent powder. However, each of these patents and patent application publications, which are incorporated herein by reference in their entirety, use time consuming and sometimes complicated and expensive techniques which may require special tool sets to apply the wavelength conversion film to the solar cell device. These techniques include spin coating, drop casting, sedimentation, solvent evaporation, chemical vapor deposition, physical vapor deposition, etc.

SUMMARY OF THE INVENTION

Some embodiments of the present invention provide a wavelength conversion film comprising a wavelength conversion layer and an adhesive layer. In some embodiments, the wavelength conversion layer comprises a polymer matrix and at least one photostable chromophore. In some embodiments, the adhesive layer comprises a pressure sensitive adhesive.

Some embodiments of the present invention involve a method of improving the performance of a solar energy conversion device. In some embodiments, the method for improving the performance of the solar energy conversion device comprises applying a wavelength conversion film according to the solar energy conversion device, and adhering an adhesive layer to a light incident to the surface of the solar energy conversion device.

Some embodiments of the present invention involve a method of forming the wavelength conversion film. In some embodiments, forming the wavelength conversion film comprises the steps of forming a wavelength conversion layer, forming a protective layer and laminating it directly onto the wavelength conversion layer, and laminating an adhesive layer with a removable liner onto the wavelength conversion layer on the surface opposite to the protection layer.

DETAILED DESCRIPTION

Figure 1:
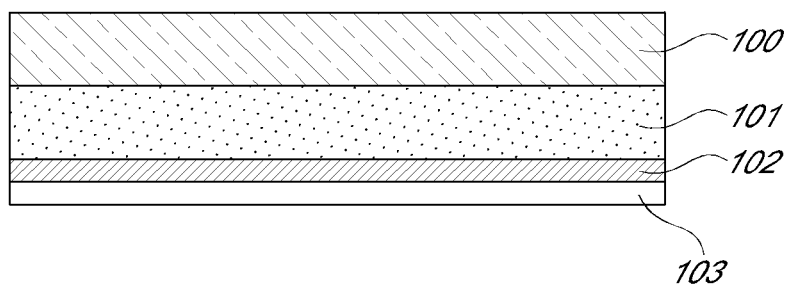
FIG. 1 illustrates an embodiment of a wavelength conversion film comprising a protective layer, a wavelength conversion layer, an adhesive layer, and a removable liner.

The present disclosure relates to a wavelength conversion film, which when applied to the light incident surface of a solar energy conversion device (such as solar cell, solar panel, photovoltaic device, and the likes) the photoelectric conversion efficiency is enhanced. The inventors have surprisingly discovered that a wavelength conversion film can be constructed utilizing a wavelength conversion layer, an adhesive layer, optionally a protective layer, and optionally a removable liner layer, which can be easily applied to a solar cell by removing the removable liner layer, if present, and pressing the adhesive layer onto the light incident surface of the solar cell. Application of the pressure sensitive adhesive type of film enhances the solar harvesting efficiency of the solar cell device. The pressure sensitive adhesive type of film can be constructed to be compatible with all different types of solar cells and solar panels, including Silicon based devices, III-V and II-VI PN junction devices, CIGS thin film devices, organic sensitizer devices, organic thin film devices, CdS/CdTe thin film devices, dye sensitized devices, etc. Devices, such as an amorphous Silicon solar cell, a microcrystalline Si Icon solar cell, and a crystalline Silicon solar cell, can also be improved. Additionally, the film is applicable to new devices or older, already in service devices, and can be cut as needed to fit the device.

In some embodiments, the wavelength conversion layer of the wavelength conversion film comprises at least one chromophore and a polymer matrix. A chromophore compound, also referred to as a luminescent dye or florescent dye, is a compound that absorbs photons of a particular wavelength or wavelength range, and re-emits the photon at a different wavelength or wavelength range. Chromophores used in film media can greatly enhance the performance of solar cells and photovoltaic devices. However, such devices are often exposed to extreme environmental conditions for long periods of time, e.g., 20 plus years. As such, maintaining the stability of the chromophore over a long period of time is important. In some embodiments, chromophore compounds with good photostability for long periods of time, e.g., 20,000 plus hours of illumination under one sun (AM1.5G) irradiation with <10% degradation, are preferably used in the wavelength conversion films described herein.

In some embodiments, the chromophore is configured to convert incoming photons of a first wavelength to a different second wavelength. Various chromophores can be used. In some embodiments, the photostable chromophore is an organic dye selected from the group consisting of perylene derivative dyes, benzotriazole derivative dyes, benzothiadiazole derivative dyes, and combinations thereof.

In some embodiments, the chromophores represented by general formulae I-a, I-b, II-a, II-b, III-a, III-b, IV, and V are useful as fluorescent dyes in various applications, including in wavelength conversion films. As shown in the formulae, the dye comprises a benzo heterocyclic system in some embodiments. In some embodiments, perylene derivative dye may be used. Additional detail and examples, without limiting the scope of the invention, on the types of compounds that can be used are described below.

As used herein, an "electron donor group" is defined as any group which increases the electron density of the 2H-benzo[d][1,2,3]triazole system.

An "electron donor linker" is defined as any group that can link two 2H-benzo[d][1,2,3]triazole systems providing conjugation of their π orbitals, which can also increase or have neutral effect on the electron density of the 2H-benzo[d][1,2,3]triazole to which they are connected.

An "electron acceptor group" is defined as any group which decreases the electron density of the 2H-benzo[d][1,2,3]triazole system. The placement of an electron acceptor group at the N-2 position of the 2H-benzo[d][1,2,3]triazole ring system.

The term "alkyl" refers to a branched or straight fully saturated acyclic aliphatic hydrocarbon group (i.e. composed of carbon and hydrogen containing no double or triple bonds). Alkyls include, but are not limited to, methyl, ethyl, propyl, isopropyl, butyl, isobutyl, tertiary butyl, pentyl, hexyl, and the like.

The term "heteroaryl" used herein refers to an aromatic group comprising one or more heteroatoms, whether one ring or multiple fused rings. When two or more heteroatoms are present, they may be the same or different. In fused ring systems, the one or more heteroatoms may be present in only one of the rings. Examples of heteroaryl groups include, but are not limited to, benzothiazyl, benzoxazyl, quinazolinyl, isoquinolinyl, quinoxalinyl, pyridinyl, pyrrolyl, oxazolyl, indolyl, thiazyl, and the like.

The term "cycloalkyl" used herein refers to saturated aliphatic ring system radical having three to twenty carbon atoms including, but not limited to, cyclopropyl, cyclopentyl, cyclohexyl, cycloheptyl, and the like.

The term "alkenyl" used herein refers to a monovalent straight or branched chain radical of from two to twenty carbon atoms containing a carbon double bond including, but not limited to, 1-propenyl, 2-propenyl, 2-methyl-1-propenyl, 1-butenyl, 2-butenyl, and the like.

The term "alkynyl" used herein refers to a monovalent straight or branched chain radical of from two to twenty carbon atoms containing a carbon triple bond including, but not limited to, 1-propynyl, 1-butynyl, 2-butynyl, and the like.

The term "aryl" used herein refers to homocyclic aromatic radical whether one ring or multiple fused rings. Examples of aryl groups include, but are not limited to, phenyl, naphthyl, phenanthrenyl, naphthacenyl, fluorenyl, pyrenyl, and the like. Further examples include:

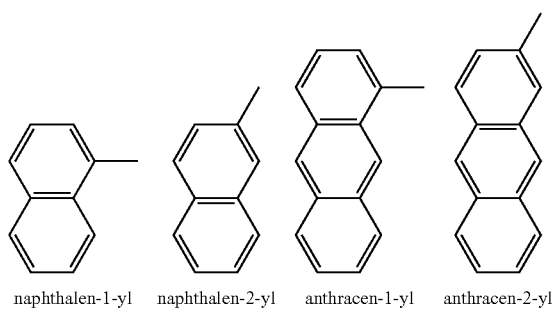

naphthalen-1-yl  naphthalen-2-yl  anthracen-1-yl  anthracen-2-yl

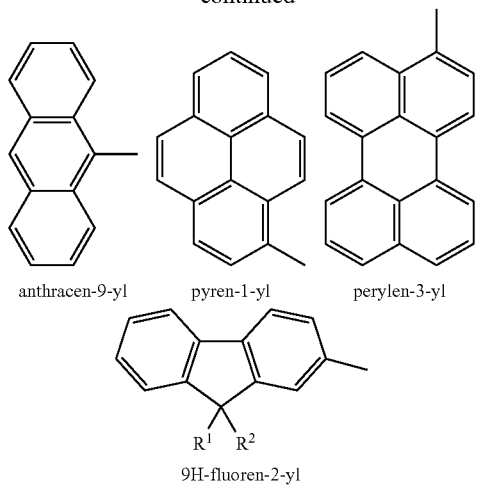

anthracen-9-yl    pyren-1-yl    perylen-3-yl 9H-fluoren-2-yl

The term "heteroaryl" used herein refers to an aromatic group comprising one or more heteroatoms, whether one ring or multiple fused rings. When two or more heteroatoms are present, they may be the same or different. In fused ring systems, the one or more heteroatoms may be present in only one of the rings. Examples of heteroaryl groups include, but are not limited to, benzothiazyl, benzoxazyl, quinazolinyl, quinolinyl, isoquinolinyl, quinoxalinyl, pyridinyl, pyrrolyl, oxazolyl, indolyl, thiazyl and the like.

The term "alkaryl" or "alkylaryl" used herein refers to an alkyl-substituted aryl radical. Examples of alkaryl include, but are not limited to, ethylphenyl, 9,9-dihexyl-9H-fluorene, and the like.

The term "aralkyl" or "arylalkyl" used herein refers to an aryl-substituted alkyl radical. Examples of aralkyl include, but are not limited to, phenylpropyl, phenylethyl, and the like.

The term "heteroaryl" used herein refers to an aromatic ring system radical in which one or more ring atoms are heteroatoms, whether one ring or multiple fused rings. When two or more heteroatoms are present, they may be the same or different. In fused ring systems, the one or more heteroatoms may be present in only one of the rings. Examples of heteroaryl groups include, but are not limited to, benzothiazyl, benzoxazyl, quinazolinyl, quinolinyl, isoquinolinyl, quinoxalinyl, pyridinyl, pyridazinyl, pyrimidinyl, pyrazinyl, pyrrolyl, oxazolyl, indolyl, thiazyl, and the like. Further examples of substituted and unsubstituted heteroaryl rings include:

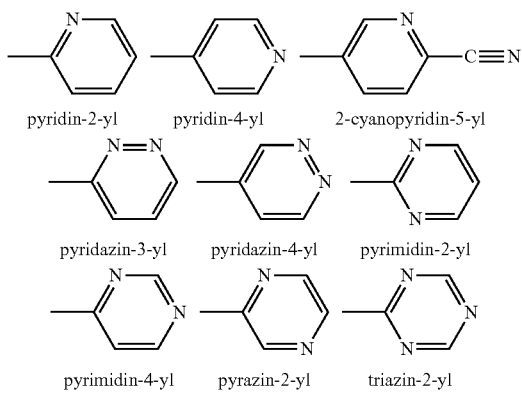

pyridin-2-yl    pyridin-4-yl    2-cyanopyridin-5-yl pyridazin-3-yl    pyridazin-4-yl    pyrimidin-2-yl pyrimidin-4-yl    pyrazin-2-yl    triazin-2-yl

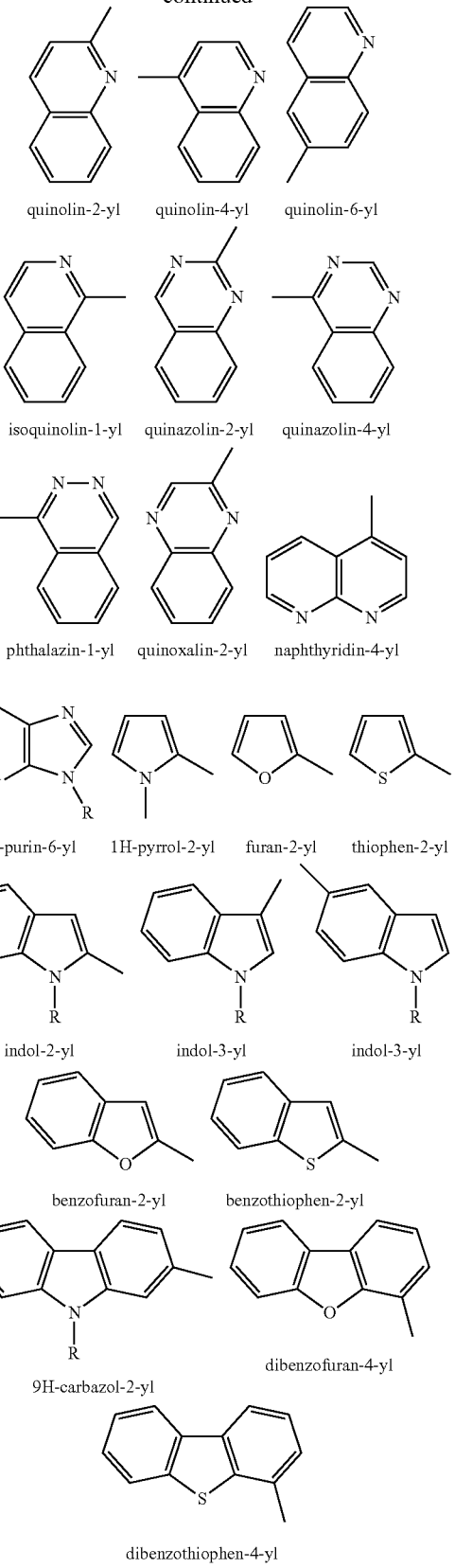

quinolin-2-yl    quinolin-4-yl    quinolin-6-yl isoquinolin-1-yl    quinazolin-2-yl    quinazolin-4-yl phthalazin-1-yl    quinoxalin-2-yl    naphthyridin-4-yl 9H-purin-6-yl    1H-pyrrol-2-yl    furan-2-yl    thiophen-2-yl indol-2-yl    indol-3-yl    indol-3-yl benzofuran-2-yl    benzothiophen-2-yl 9H-carbazol-2-yl    dibenzofuran-4-yl dibenzothiophen-4-yl The term "alkoxy" used herein refers to straight or branched chain alkyl radical covalently bonded to the parent molecule through an —O— linkage. Examples of alkoxy groups include, but are not limited to, methoxy, ethoxy, propoxy, isopropoxy, butoxy, n-butoxy, sec-butoxy, t-butoxy and the like.

The term "heteroatom" used herein refers to S (sulfur), N (nitrogen), and O (oxygen).

The term "cyclic amino" used herein refers to either secondary or tertiary amines in a cyclic moiety. Examples of cyclic amino groups include, but are not limited to, aziridinyl, piperidinyl, N-methylpiperidinyl, and the like.

The term "cyclic imido" used herein refers to an imide in the radical of which the two carbonyl carbons are connected by a carbon chain. Examples of cyclic imide groups include, but are not limited to, 1,8-naphthalimide, pyrrolidine-2,5-dione, 1H-pyrrole-2,5-dione, and the likes.

The term "aryloxy" used herein refers to an aryl radical covalently bonded to the parent molecule through an —O— linkage.

The term "acyloxy" used herein refers to a radical R—C(=O)O—,

The term "carbamoyl" used herein refers to —NHC(=O)R.

The term "keto" and "carbonyl" used herein refers to C=O.

The term "carboxy" used herein refers to —COOH.

The term "ester" used herein refers to C(=O)O.

The term "amido" used herein refers to —NRC(=O)R'.

The term "amino" used herein refers to —NR'R"

As used herein, a substituted group is derived from the unsubstituted parent structure in which there has been an exchange of one or more hydrogen atoms for another atom or group. When substituted, the substituent group(s) is (are) one or more group(s) individually and independently selected from $C_1$-$C_6$ alkyl, $C_1$-$C_6$ alkenyl, $C_1$-$C_6$ alkynyl, $C_3$-$C_7$ cycloalkyl (optionally substituted with halo, alkyl, alkoxy, carboxyl, haloalkyl, CN, —$SO_2$-alkyl, —$CF_3$, and —$OCF_3$), cycloalkyl geminally attached, $C_1$-$C_6$ heteroalkyl, $C_3$-$C_{10}$ heterocycloalkyl (e.g., tetrahydrofuryl) (optionally substituted with halo, alkyl, alkoxy, carboxyl. CN, —$SO_2$-alkyl, —$CF_3$, and —$OCF_3$), aryl (optionally substituted with halo, alkyl, aryl optionally substituted with $C_1$-$C_6$ alkyl, arylalkyl, alkoxy, aryloxy, carboxyl, amino, imido, amido(carbamoyl), optionally substituted cyclic imido, cylic amido, CN, —NH—C(=O)-alkyl, —$CF_3$, and —$OCF_3$), arylalkyl (optionally substituted with halo, alkyl, alkoxy, aryl, carboxyl, CN, —$SO_2$-alkyl; —$CF_3$, and —$OCF_3$), heteroaryl (optionally substituted with halo, alkyl, alkoxy, aryl, heteroaryl, aralkyl, carboxyl, CN, —$SO_2$-alkyl, —$CF_3$, and —$OCF_3$), halo (e.g., chloro, bromo, iodo and fluoro), cyano, hydroxy, optionally substituted cyclic imido, amino, imido, amido, —$CF_3$, $C_1$-$C_6$ alkoxy, aryloxy, acyloxy, sulfhydryl(mercapto), halo($C_1$-$C_6$)alkyl, $C_1$-$C_6$ alkylthio, arylthio, mono- and di-($C_1$-$C_6$)alkyl amino, quaternary ammonium salts, amino($C_1$-$C_6$)alkoxy, hydroxy($C_1$-$C_6$)alkylamino, amino($C_1$-$C_6$)alkylthio, cyanoamino, nitro, carbamoyl, keto (oxy), carbonyl, carboxy, glycolyl, glycyl, hydrazino, guanyl, sulfamyl, sulfonyl, sulfinyl, thiocarbonyl, thiocarboxy, sulfonamide, ester, C-amide, N-amide, N-carbamate, O-carbamate, urea and combinations thereof. Wherever a substituent is described as "optionally substituted" that substituent can be substituted with the above substituents.

Formulae I-a and I-b

Some embodiments provide a chromophore having one of the structures below:

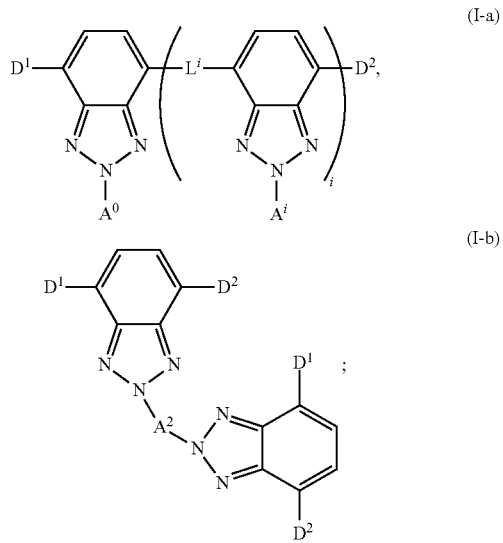

wherein $D^1$ and $D^2$ are electron donating groups, $L^i$ is an electron donor linker, and $A^0$ and $A^i$ are electron acceptor groups. In some embodiments, where more than one electron donor group is present, the other electron donor groups may be occupied by another electron donor, a hydrogen atom, or another neutral substituent. In some embodiments, at least one of the $D^1$, $D^2$, and $L^i$ is a group which increases the electron density of the 2H-benzo[d][1,2,3]triazole system to which it is attached.

In formulae I-a and I-b, i is an integer in the range of 0 to 100. In some embodiments, i is an integer in the range of 0 to 50, 0 to 30, 0 to 10, 0 to 5, or 0 to 3. In some embodiments, i is 0, 1, 2, 3, 4, 5, 6, 7, 8, 9, or 10.

In formulae I-a and I-b, $A^0$ and $A^i$ are each independently selected from the group consisting of optionally substituted alkyl, optionally substituted alkenyl, optionally substituted heteroalkyl, optionally substituted aryl, optionally substituted heteroaryl, optionally substituted amino, optionally substituted amido, optionally substituted cyclic amido, optionally substituted cyclic imido, optionally substituted alkoxy, and optionally substituted carboxy, and optionally substituted carbonyl.

In some embodiments, $A^0$ and $A^i$ are each independently selected from the group consisting of optionally substituted heteroaryl, optionally substituted aryl, optionally substituted cyclic imido, optionally substituted $C_{1-8}$ alkyl, and optionally substituted $C_{1-8}$ alkenyl; wherein the substituent for optionally substituted heteroaryl is selected from the group consisting of alkyl, aryl and halogen; the substitutent for optionally substituted aryl is —$NR^1$—C(=O)$R^2$ or optionally substituted cyclic imido, wherein $R^1$ and $R^2$ are as described above.

In some embodiments, $A^0$ and $A^i$ are each independently phenyl substituted with a moiety selected from the group consisting of —$NR^1$—C(=O)$R^2$ and optionally substituted cyclic imido, wherein $R^1$ and $R^2$ are as described above.

In some embodiments, $A^0$ and $A^i$ are each optionally substituted heteroaryl or optionally substituted cyclic imido; wherein the substituent for optionally substituted heteroaryl and optionally substituted cyclic imido is selected from the group consisting of alkyl, aryl and halogen. In some embodiments, at least one of the $A^0$ and $A^i$ is selected from the group consisting of: optionally substituted pyridinyl, optionally substituted pyridazinyl, optionally substituted pyrimidinyl, optionally substituted pyrazinyl, optionally substituted triazinyl, optionally substituted quinolinyl, optionally substituted isoquinolinyl, optionally substituted quinazolinyl, optionally substituted phthalazinyl, optionally substituted quinoxalinyl, optionally substituted naphthyridinyl, and optionally substituted purinyl.

In other embodiments, $A^0$ and $A^i$ are each optionally substituted alkyl. In other embodiments, $A^0$ and $A^i$ are each optionally substituted alkenyl. In some embodiments, at least one of the $A^0$ and $A^i$ is selected from the group consisting of:

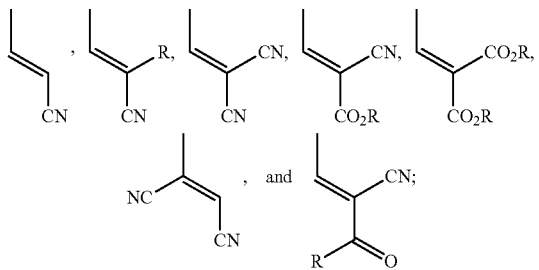

wherein R is optionally substituted alkyl.

In formula I-a and I-b, $A^2$ is selected from the group consisting of optionally substituted alkylene, optionally substituted alkenylene, optionally substituted arylene, optionally substituted heteroarylene, ketone, ester, and

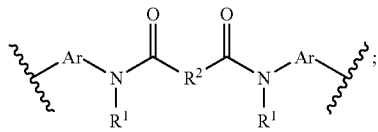

wherein Ar is optionally substituted aryl or optionally substituted heteroaryl. $R^1$ is selected from the group consisting of H, alkyl, alkenyl, aryl, heteroaryl, aralkyl, alkaryl; and $R^2$ is selected from the group consisting of optionally substituted alkylene, optionally substituted alkenylene, optionally substituted arylene, optionally substituted heteroarylene, ketone, and ester; or $R^1$ and $R^2$ may be connected together to form a ring.

In some embodiments, $A^2$ is selected from the group consisting of optionally substituted arylene, optionally substituted heteroarylene, and

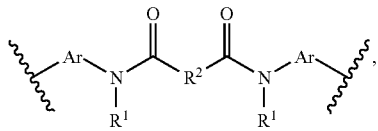

wherein Ar, $R^1$ and $R^2$ are as described above.

In formulae I-a and I-b, $D^1$ and $D^2$ are each independently selected from the group consisting of hydrogen, optionally substituted alkoxy, optionally substituted aryloxy, optionally substituted acyloxy, optionally substituted alkyl, optionally substituted aryl, optionally substituted heteroaryl, optionally substituted amino, amido, cyclic amido, and cyclic imido, provided that $D^1$ and $D^2$ are not both hydrogen.

In some embodiments, $D^1$ and $D^2$ are each independently selected from the group consisting of hydrogen, optionally substituted aryl, optionally substituted heteroaryl, and amino, provided that $D^1$ and $D^2$ are not both hydrogen. In some embodiments, $D^1$ and $D^2$ are each independently selected from the group consisting of hydrogen, optionally substituted aryl, optionally substituted heteroaryl, and diphenylamino, provided that $D^1$ and $D^2$ are not both hydrogen.

In some embodiments, $D^1$ and $D^2$ are each independently optionally substituted aryl. In some embodiments, $D^1$ and $D^2$ are each independently phenyl optionally substituted by alkoxy or amino. In other embodiments, $D^1$ and $D^2$ are each independently selected from hydrogen, optionally substituted benzofuranyl, optionally substituted thiophenyl, optionally substituted furanyl, dihydrothienodioxinyl, optionally substituted benzothiophenyl, and optionally substituted dibenzothiophenyl, provided that $D^1$ and $D^2$ are not both hydrogen.

In some embodiments, the substituent for optionally substituted aryl and optionally substituted heteroaryl may be selected from the group consisting of alkoxy, aryloxy, aryl, heteroaryl, and amino.

In formulae I-a and I-b, $L^i$ is each independently selected from the group consisting of optionally substituted alkylene, optionally substituted alkenylene, optionally substituted alkynylene, optionally substituted arylene, optionally substituted heteroarylene. In some embodiments, $L^i$ is selected from the group consisting of optionally substituted heteroarylene and optionally substituted arylene.

In some embodiments, at least one of the $L^i$ is selected from the group consisting of: 1,2-ethylene, acetylene, 1,4-phenylene, 1,1'-biphenyl-4,4'-diyl, naphthalene-2,6-diyl, naphthalene-1,4-diyl, 9H-fluorene-2,7-diyl, perylene-3,9-diyl, perylene-3,10-diyl, or pyrene-1,6-diyl, 1H-pyrrole-2,5-diyl, furan-2,5-diyl, thiophen-2,5-diyl, thieno[3,2-b]thiophene-2,5-diyl, benzo[c]thiophene-1,3-diyl, dibenzo[b,d]thiophene-2,8-diyl, 9H-carbozole-3,6-diyl, 9H-carbozole-2,7-diyl, dibenzo[b,d]furan-2,8-diyl, 10H-phenothiazine-3,7-diyl, and 10H-phenothiazine-2,8-diyl; wherein each moiety is optionally substituted.

Formulae II-a and II-b

Some embodiments provide a chromophore having one of the structures below:

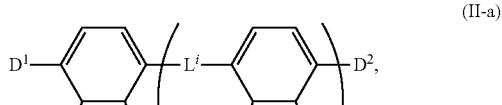
(II-a)

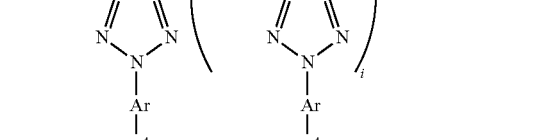
(II-b)

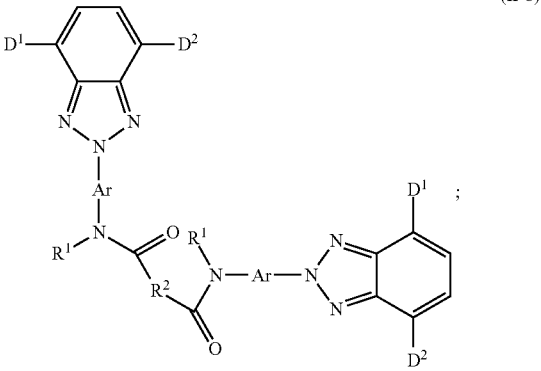

wherein i is an integer in the range of 0 to 100. In some embodiments, i is an integer in the range of 0 to 50, 0 to 30, 0 to 10, 0 to 5, or 0 to 3. In some embodiments, i is 0, 1, 2, 3, 4, 5, 6, 7, 8, 9, or 10.

In formulae II-a and II-b, Ar is optionally substituted aryl or optionally substituted heteroaryl. In some embodiments, aryl substituted with an amido or a cyclic imido group at the N-2 position of the 2H-benzo[d][1,2,3]triazole ring system provides unexpected and improved benefits.

In formulae II-a and II-b, $R^4$ is

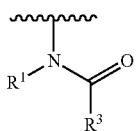

or optionally substituted cyclic imido; $R^1$ is each independently selected from the group consisting of H, alkyl, alkenyl, aryl, heteroaryl, aralkyl, alkaryl; $R^3$ is each independently selected from the group consisting of optionally substituted alkyl, optionally substituted alkenyl, optionally substituted aryl, optionally substituted heteroaryl; or R' and R" may be connected together to form a ring.

In some embodiments, $R^4$ is optionally substituted cyclic imido selected from the group consisting of:

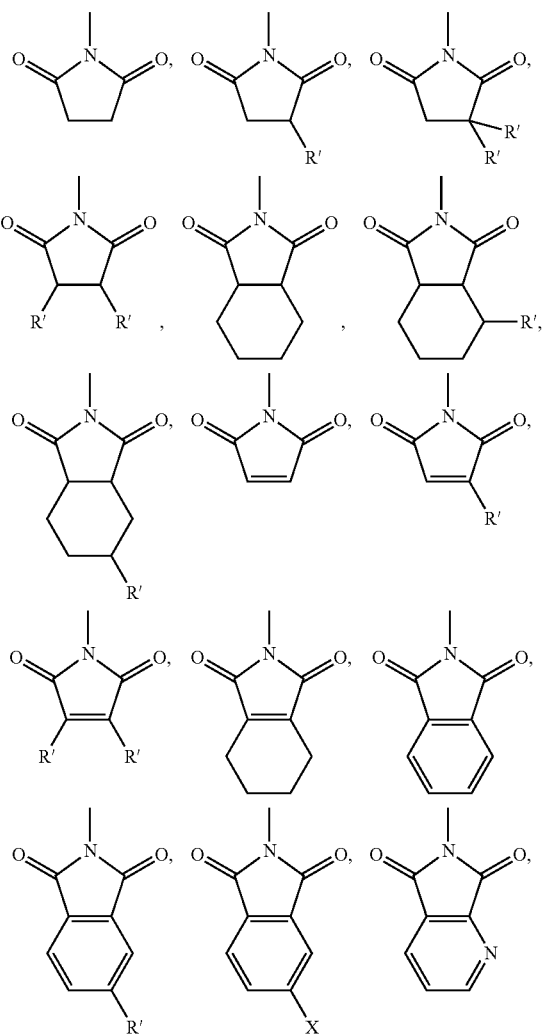

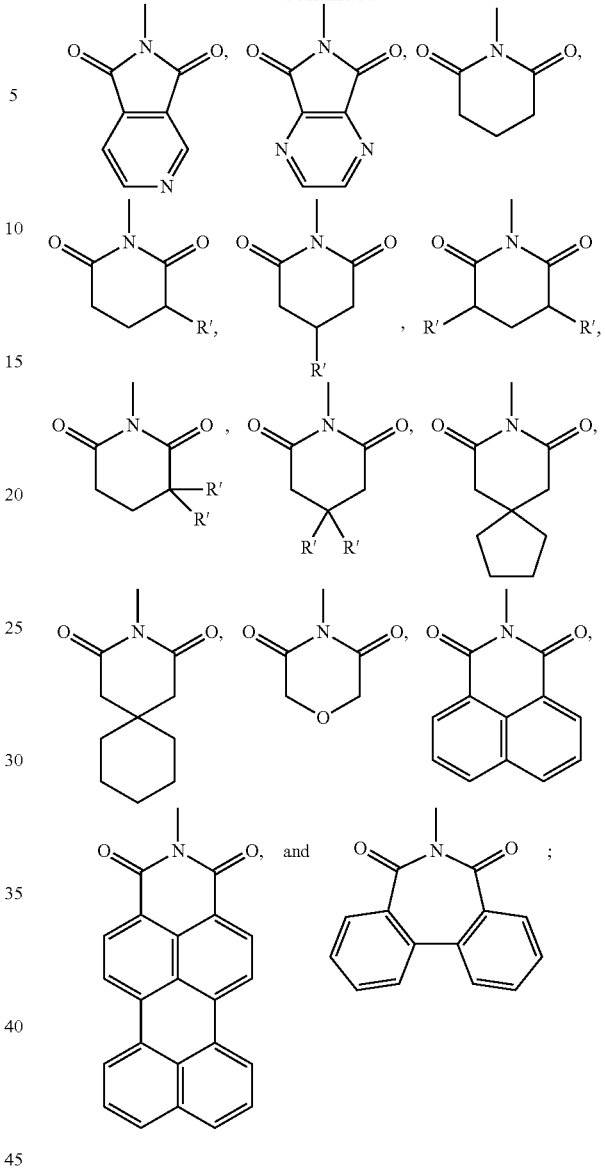

and wherein R' is each optionally substituted alkyl or optionally substituted aryl; and X is optionally substituted heteroalkyl.

In formulae II-a and II-b, $R^2$ is selected from the group consisting of optionally substituted alkylene, optionally substituted alkenylene, optionally substituted arylene, optionally substituted heteroarylene.

In formulae II-a and II-b, $D^1$ and $D^2$ are each independently selected from the group consisting of hydrogen, optionally substituted alkoxy, optionally substituted aryloxy, optionally substituted acyloxy, optionally substituted alkyl, optionally substituted aryl, optionally substituted heteroaryl, optionally substituted amino, amido, cyclic amido, and cyclic imido, provided that $D^1$ and $D^2$ are not both hydrogen.

In formulae II-a and II-b, $L^i$ is independently selected from the group consisting of optionally substituted alkylene, optionally substituted alkenylene, optionally substituted alkynylene, optionally substituted arylene, optionally substituted heteroarylene.

In some embodiments, at least one of the $L^i$ is selected from the group consisting of: 1,2-ethylene, acetylene, 1,4-phenylene, 1,1'-biphenyl-4,4'-diyl, naphthalene-2,6-diyl, naphthalene-1,4-diyl, 9H-fluorene-2,7-diyl, perylene-3,9-diyl, perylene-3,10-diyl, or pyrene-1,6-diyl, 1H-pyrrole-2,5-diyl, furan-2,5-diyl, thiophen-2,5-diyl, thieno[3,2-b]thiophene-2,5-diyl, benzo[c]thiophene-1,3-diyl, dibenzo[b,d]thiophene-2,8-diyl, 9H-carbozole-3,6-diyl, 9H-carbozole-2,7-diyl, dibenzo[b,d]furan-2,8-diyl, 10H-phenothiazine-3,7-diyl, and 10H-phenothiazine-2,8-diyl; wherein each moiety is optionally substituted.

Formulae III-a and III-b

Some embodiments provide a chromophore having one of the structures below:

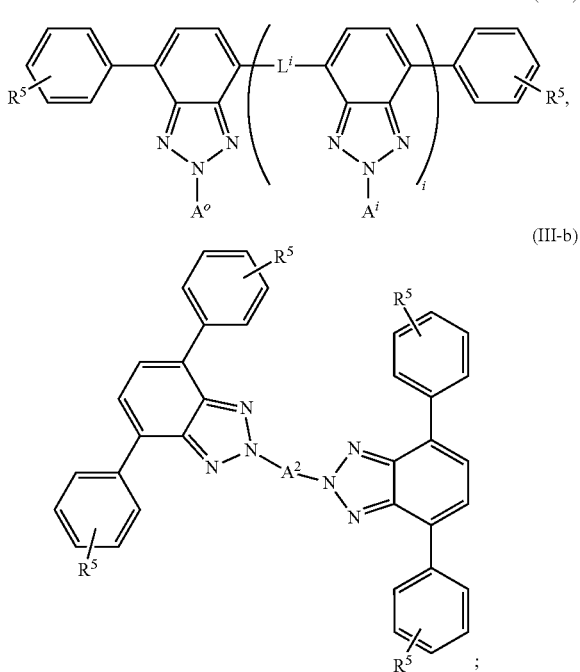

The placement of an alkyl group in formulae (III-a) and (III-b) at the N-2 position of the 2H-benzo[d][1,2,3]triazole ring system along with substituted phenyls at the C-4 and C-7 positions provides unexpected and improved benefits. In formula III-a and III-b, i is an integer in the range of 0 to 100. In some embodiments, i is an integer in the range of 0 to 50, 0 to 30, 0 to 10, 0 to 5, or 0 to 3. In some embodiments, i is 0, 1, 2, 3, 4, 5, 6, 7, 8, 9, or 10.

In formula III-a and III-b, $A^o$ and $A^i$ are each independently selected from the group consisting of optionally substituted alkyl, optionally substituted alkenyl, optionally substituted heteroalkyl, optionally substituted amido, optionally substituted alkoxy, optionally substituted cabonyl, and optionally substituted carboxy.

In some embodiments, $A^o$ and $A^i$ are each independently unsubstituted alkyl or alkyl substituted by a moiety selected from the group consisting of: —NRR", —OR, —COOR, —COR, —CONHR, —CONRR", halo and —CN; wherein R is $C_1$-$C_{20}$ alkyl, and R" is hydrogen or $C_1$-$C_{20}$ alkyl. In some embodiments, the optionally substituted alkyl may be optionally substituted $C_1$-$C_{40}$ alkyl. In some embodiments, $A^o$ and the $A^i$ are each independently $C_1$-$C_{40}$ alkyl or $C_1$-$C_{20}$ haloalkyl.

In some embodiments, $A^o$ and $A^i$ are each independently $C_1$-$C_{20}$ haloalkyl, $C_1$-$C_{40}$ arylalkyl, or $C_1$-$C_{20}$ alkenyl.

In formulae III-a and III-b, each $R^5$ is independently selected from the group consisting of optionally substituted alkoxy, optionally substituted aryloxy, optionally substituted acyloxy, and amino. In some embodiments, $R^5$ may attach to phenyl ring at ortho and/or para position. In some embodiments, $R^5$ is independently selected from $C_1$-$C_{40}$ alkoxy, In formulae III-a and III-b, $A^2$ is selected from the group consisting of optionally substituted alkylene, optionally substituted alkenylene, optionally substituted arylene, optionally substituted heteroarylene, ketone, ester, and

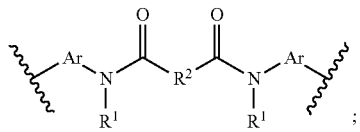

wherein Ar is optionally substituted aryl or optionally substituted heteroaryl. $R^1$ is selected from the group consisting of H, alkyl, alkenyl, aryl, heteroaryl, aralkyl, alkaryl; and $R^2$ is selected from the group consisting of optionally substituted alkylene, optionally substituted alkenylene, optionally substituted arylene, optionally substituted heteroarylene, ketone, and ester; or $R^1$ and $R^2$ may be connected together to form a ring.

In formulae III-a and III-b, $L^i$ is independently selected from the group consisting of optionally substituted alkylene, optionally substituted alkenylene, optionally substituted alkynylene, optionally substituted arylene, optionally substituted heteroarylene.

In some embodiments, at least one of the $L^i$ is selected from the group consisting of: 1,2-ethylene, acetylene, 1,4-phenylene, 1,1'-biphenyl-4,4'-diyl, naphthalene-2,6-diyl, naphthalene-1,4-diyl, 9H-fluorene-2,7-diyl, perylene-3,9-diyl, perylene-3,10-diyl, or pyrene-1,6-diyl, 1H-pyrrole-2,5-diyl, furan-2,5-diyl, thiophen-2,5-diyl, thieno[3,2-b]thiophene-2,5-diyl, benzo[c]thiophene-1,3-diyl, dibenzo[b,d]thiophene-2,8-diyl, 9H-carbozole-3,6-diyl, 9H-carbozole-2,7-diyl, dibenzo[b,d]furan-2,8-diyl, 10H-phenothiazine-3,7-diyl, and 10H-phenothiazine-2,8-diyl; wherein each moiety is optionally substituted.

Formula IV

Some embodiments provide a chromophore having the structure below:

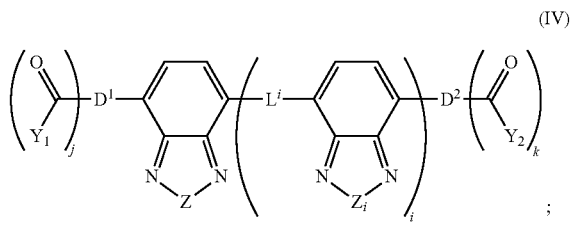

wherein i is an integer in the range of 0 to 100. In some embodiments, i is an integer in the range of 0 to 50, 0 to 30, 0 to 10, 0 to 5, or 0 to 3. In some embodiments, i is 0, 1, 2, 3, 4, 5, 6, 7, 8, 9, or 10.

In formula IV, Z and $Z_i$ are each independently selected from the group consisting of —O—, —S—, —Se—, —Te—, —$NR^6$—, —$CR^6$=$CR^6$—, and —$CR^6$=N—, wherein $R^6$ is hydrogen, optionally substitute $C_1$-$C_6$ alkyl, or optionally substituted $C_1$-$C_{10}$ aryl; and In formula IV, $D^1$ and $D^2$ are independently selected from the group consisting of optionally substituted alkoxy, optionally substituted aryloxy, optionally substituted acyloxy, optionally substituted alkyl, optionally substituted aryl, optionally substituted heteroaryl, optionally substituted amino, amido, cyclic amido, and cyclic imido; j is 0, 1 or 2, and k is 0, 1, or 2. In some embodiments, the —C(=O)Y$_1$ and —C(=O)Y$_2$ groups may attach to the substituent(s) of the optionally substituted moiety for D$^1$ and D$^2$.

In formula IV, Y$_1$ and Y$_2$ are independently selected from the group consisting of optionally substituted aryl, optionally substituted alkyl, optionally substituted cycloalkyl, optionally substituted alkoxy, and optionally substituted amino; and In formula IV, L$^i$ is independently selected from the group consisting of optionally substituted alkylene, optionally substituted alkenylene, optionally substituted alkynylene, optionally substituted arylene, optionally substituted heteroarylene.

In some embodiments, at least one of the L$^i$ is selected from the group consisting of 1,2-ethylene, acetylene, 1,4-phenylene, 1,1'-biphenyl-4,4'-diyl, naphthalene-2,6-diyl, naphthalene-1,4-diyl, 9H-fluorene-2,7-diyl, perylene-3,9-diyl, perylene-3,10-diyl, or pyrene-1,6-diyl, 1H-pyrrole-2,5-diyl, furan-2,5-diyl, thiophen-2,5-diyl, thieno[3,2-b]thiophene-2,5-diyl, benzo[c]thiophene-1,3-diyl, dibenzo[b,d]thiophene-2,8-diyl, 9H-carbozole-3,6-diyl, 9H-carbozole-2,7-diyl, dibenzo[b,d]furan-2,8-diyl, 10H-phenothiazine-3,7-diyl, and 10H-phenothiazine-2,8-diyl; wherein each moiety is optionally substituted.

With regard to L$^i$ in any of the formulae above, the electron linker represents a conjugated electron system, which may be neutral or serve as an electron donor itself. In some embodiments, some examples are provided below, which may or may not contain additional attached substituents.

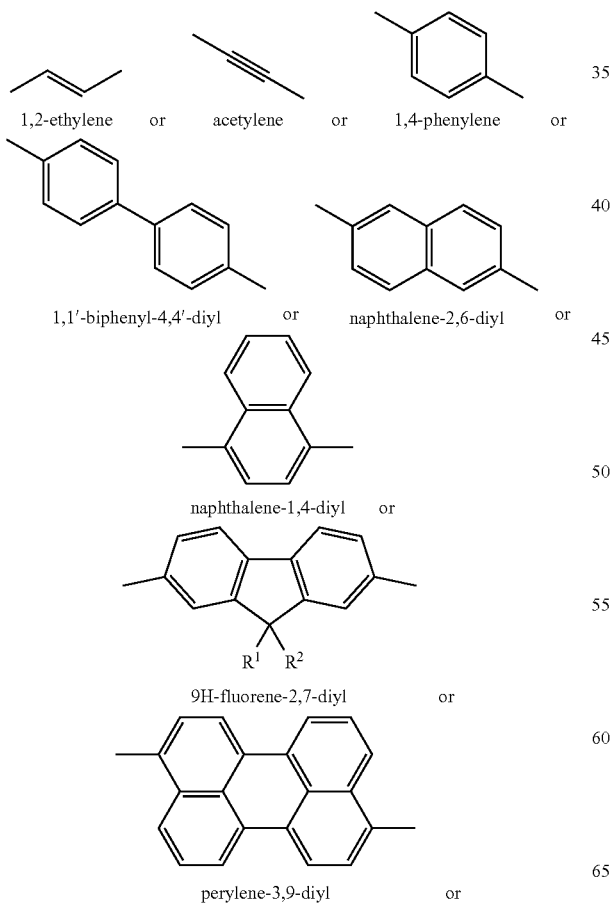

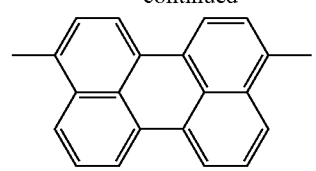

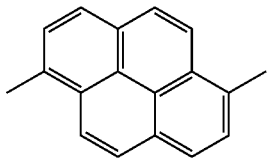 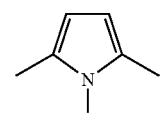

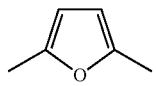 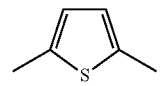 

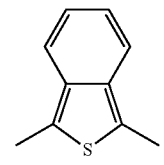

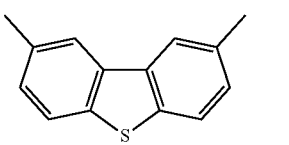

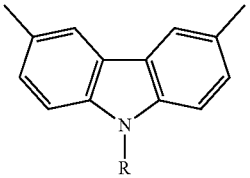

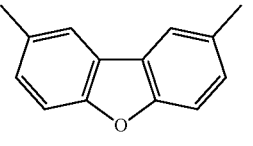

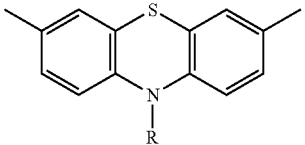

Formulae V-a and V-b

Some embodiments provide a perylene diester derivative represented by the following general formula (V-a) or general formula (V-b):

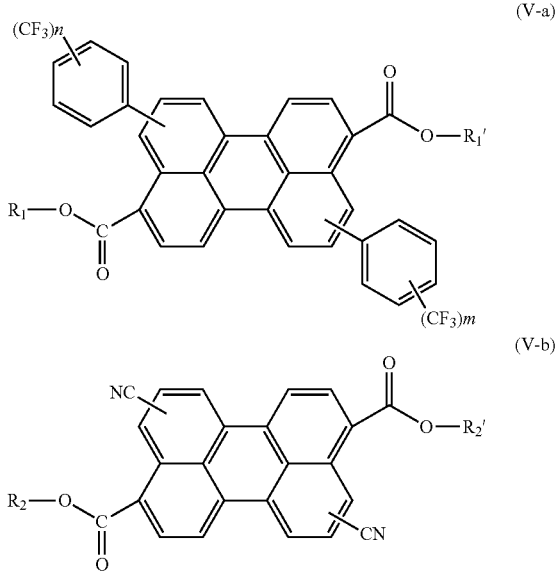

wherein $R_1$ and $R_1'$ in formula (I) are each independently selected from the group consisting of hydrogen, $C_1$-$C_{10}$ alkyl, $C_3$-$C_{10}$ cycloalkyl, $C_2$-$C_{10}$ alkoxyalkyl, $C_6$-$C_{18}$ aryl, and $C_6$-$C_{20}$ aralkyl; m and n in formula (I) are each independently in the range of from 1 to 5; and $R_2$ and $R_2'$ in formula (II) are each independently selected from the group consisting of a $C_6$-$C_{18}$ aryl and $C_6$-$C_{20}$ aralkyl. In an embodiment, if one of the cyano groups on formula (II) is present on the 4-position of the perylene ring, then the other cyano group is not present on the 10-position of the perylene ring. In an embodiment, if one of the cyano groups on formula (II) is present on the 10-position of the perylene ring, then the other cyano group is not present on the 4-position of the perylene ring.

In an embodiment, $R_1$ and are independently selected from the group consisting of hydrogen, $C_1$-$C_6$ alkyl, $C_2$-$C_6$ alkoxyalkyl, and $C_6$-$C_{18}$ aryl. In an embodiment, $R_1$ and $R_1'$ are each independently selected from the group consisting of isopropyl, isobutyl, isohexyl, isooctyl, 2-ethyl-hexyl, diphenylmethyl, trityl, and diphenyl. In an embodiment, $R_2$ and $R_2'$ are independently selected from the group consisting of diphenylmethyl, trityl, and diphenyl. In an embodiment, each m and n in formula (I) is independently in the range of from 1 to 4.

In some embodiments, the at least one photostable chromophore is present in the polymer matrix of any wavelength conversion layer (or sublayer) in an amount in the range of about 0.01 wt % to about 10 wt %, by weight of the polymer matrix. In some embodiments, the at least one photostable chromophore is present in the polymer matrix of any wavelength conversion layer (or sublayer) in an amount in the range of about 0.01 wt % to about 3 wt %, by weight of the polymer matrix. In some embodiments, the at least one photostable chromophore is present in the polymer matrix of any wavelength conversion layer (or sublayer) in an amount in the range of about 0.05 wt % to about 2 wt %, by weight of the polymer matrix. In some embodiments, the at least one photostable chromophore is present in the polymer matrix of any wavelength conversion layer (or sublayer) in an amount in the range of about 0.1 wt % to about 1 wt %, by weight of the polymer matrix.

In some embodiments, the wavelength conversion layer comprises more than one chromophore, for example, at least two different photostable chromophores. It may be desirable to have multiple photostable chromophores in the wavelength conversion layer, depending on the solar module that the tape is to be attached. For example, in a solar module system having an optimum photoelectric conversion at about 500 nm wavelength, the efficiency of such a system can be improved by converting photons of other wavelengths into 500 nm wavelengths. In such instance, a first photostable chromophore may act to convert photons having wavelengths in the range of about 400 nm to about 450 nm into photons of a wavelength of about 500 nm, and a second photostable chromophore may act to convert photons having wavelengths in the range of about 450 nm to about 475 nm into photons of a wavelength of about 500 nm. Particular wavelength control may be selected based upon the chromophore(s) utilized.

In some embodiments, two or more chromophores are mixed together within the same layer. In some embodiments, two or more chromophores are located in separate sublayers within the wavelength conversion film. For example, the first wavelength conversion sublayer can comprise a first chromophore and a second wavelength conversion sublayer can comprise a second chromophore.

In some embodiments, where more than one chromophore is present in the wavelength conversion layer, at least one of the chromophores is an up-conversion chromophore. An up-conversion chromophore is a chromophore that converts photons from lower energy (long wavelengths) to higher energy (short wavelengths). In some embodiments, where more than one chromophore is present in the wavelength conversion layer, at least one of the chromophores is a down-shifting chromophore. A down-shifting chromophore is a chromophore that shifts photons of high energy (short wavelengths) into lower energy (long wavelengths). Thus, the wavelength conversion film may comprise an up-conversion chromophore and a down-shifting chromophore.

The wavelength conversion layer may also be subdivided into two or more sublayers, such that the wavelength conversion film comprises at least two layers that each comprises one or more chromophores. In some embodiments, the wavelength conversion layer comprises a first wavelength conversion sublayer and a second wavelength conversion sublayer. In some embodiments, the first wavelength conversion sublayer and the second wavelength conversion sublayer comprise the same or different photostable chromophores. The first wavelength conversion sublayer can comprise a first chromophore, and the second wavelength conversion sublayer can comprise a second chromophore.

The wavelength conversion layer preferably comprises a polymer matrix. Various polymers can be used. In some embodiments, the polymer matrix of the wavelength conversion layer comprises a substance selected from the group consisting of polyethylene terephthalate, polymethyl methacrylate, polyvinyl butyral, ethylene vinyl acetate, ethylene tetrafluoroethylene, polyimide, amorphous polycarbonate, polystyrene, siloxane sol-gel, polyurethane, polyacrylate, and combinations thereof.

The thickness of the wavelength conversion layer (or wavelength conversion sublayers, in combination) can vary. In some embodiments, the thickness of the wavelength conversion layer is in the range of about 10 μm to about 2 mm. In some embodiments, the thickness of the wavelength conversion layer is in the range of about 25 μm to about 1.5 mm. In some embodiments, the thickness of the wavelength conversion layer is in the range of about 50 μm to about 1 mm. The thickness can be controlled by those having ordinary skill in the art using known film deposition techniques, as guided by the disclosure herein.

In some embodiments, the wavelength conversion film further comprises a protection layer configured to maintain the stability of the chromophore in the wavelength conversion layer. For example, the protection layer can inhibit penetration of oxygen and moisture into the wavelength conversion layer. In some embodiments, the protection layer comprises a polymer matrix. In some embodiments, the polymer matrix of the protection layer comprises a substance selected from the group consisting of polyethylene terephthalate, polymethyl methacrylate, polyvinyl butyral, ethylene vinyl acetate, ethylene tetrafluoroethylene, polyimide, amorphous polycarbonate, polystyrene, siloxane sol-gel, polyurethane, polyacrylate, and combinations thereof. As with the wavelength conversion layer, the thickness of the protection layer can vary. In some embodiments, the thickness of the protection layer is in the range of about 10 µm to about 2 mm. In some embodiments, the thickness of the protection layer is in the range of about 25 µm to about 1.5 µm. In some embodiments, the thickness of the protection layer is in the range of about 50 µm to about 1 mm.

Preferably, the polymer matrix used in either the wavelength conversion layer, the protection layer, or both, has a refractive index in the range of about 1.4 to about 1.7. In some embodiments, the refractive index of the polymer matrix material in the wavelength conversion layer, the protection layer, or both, is in the range of about 1.45 to about 1.55.

Various types of adhesives may be used in the adhesive layer. Preferably, the adhesive layer comprises a pressure sensitive adhesive. The pressure sensitive adhesive can be permanent or non-permanent, or a combination of both. Preferably, the pressure sensitive adhesive is compatible with a light incident surface of the solar cell, the solar panel, or the photovoltaic device. Such light incident surfaces may comprise, for example, a glass or a polymer. In some embodiments, the adhesive layer comprises a substance selected from the group consisting of acrylic, ethylene vinyl acetate, polyurethane, and combinations thereof. The thickness of the adhesive layer can vary. In some embodiments, the thickness of the adhesive film is in the range of about 0.5 µm to about 1 mm. In some embodiments, the thickness of the adhesive film is in the range of about 1 µm to about 100 mm.

A removable liner can be present in the wavelength conversion film. The removable liner can be located adjacent to the adhesive layer, such that it prevents the adhesive layer from bonding to other objects until the liner is removed. The removable liner may comprise known materials. For example, the removable liner may comprise a material selected from fluoropolymers or polyethylene terephthalate (PET). In some embodiments, the thickness of the removable liner is in the range of about 10 µm to about 100 µm.

The total thickness of the wavelength conversion film can be represented by adding the thicknesses of each individual film described herein. In some embodiments, the thickness of the wavelength conversion film is in the range of about 10 µm to about 2 mm. In some embodiments, the thickness of the wavelength conversion film is in the range of about 1 µm to about 5 mm. In some embodiments, the thickness of the wavelength conversion film is in the range of about 50 µm to about 1 mm.

The wavelength conversion film may also comprise additional layers. For example, additional adhesive layers may be included. In some embodiments, an adhesive layer is present in between the protection layer and the wavelength conversion layer to adhere these two layers together. Other layers may also be included to further enhance the photoelectric conversion efficiency of solar modules. For example, the wavelength conversion film may have a microstructured layer on top of the protection layer or in between the protection layer and the wavelength conversion layer. The microstructured layer can be designed to further enhance the solar harvesting efficiency of solar modules by decreasing the loss of photons to the environment, which are often re-emitted from the chromophore after absorption and wavelength conversion in a direction that is away from the photoelectric conversion layer of the solar module device. A layer with various microstructures on the surface (i.e. pyramids or cones) may increase internal reflection and refraction of the photons into the photoelectric conversion layer of the device, further enhancing the solar harvesting efficiency of the device. Additional layers may also be incorporated into the pressure sensitive adhesive type of wavelength conversion film.

Methods of improving the performance of a solar cell, a solar panel, or photovoltaic device can be performed using the wavelength conversion films described herein. For example, the wavelength conversion film can be applied to a solar cell, solar panel, or photovoltaic device by using the adhesive layer of the film. In some embodiments, the film can be applied to the solar cell, solar panel, or photovoltaic device, using a roll laminator. Devices such as a Silicon based device, a III-V or II-VI PN junction device, a Copper-Indium-Gallium-Selenium (CIGS) thin film device, an organic sensitizer device, an organic thin film device, or a Cadmium Sulfide/Cadmium Telluride (CdS/CdTe) thin film device, can be improved. Such devices may comprise a light incident surface that comprises glass or a polymer. In some embodiments, the polymer of the device can be selected from the group consisting of polyethylene terephthalate, polymethyl methacrylate, polyvinyl butyral, ethylene vinyl acetate, ethylene tetrafluoroethylene, polyimide, polycarbonate, polystyrene, siloxane sol-gel, polyurethane, polyacrylate, and combinations thereof.

Solar harvesting devices may also be rigid or flexible. For example, rigid devices include Silicon based solar cells. Flexible solar devices are often made out of organic thin films and may be used on clothing, tents, or other flexible substrates. Therefore, in some embodiments, the pressure sensitive adhesive type of wavelength conversion film can be applied to rigid devices or flexible devices.

The wavelength conversion films can be manufactured in accordance with a number of different methods. In some embodiments, the method comprises the steps of a) forming a wavelength conversion layer b) forming a protective layer and laminating it directly on the wavelength conversion layer and c) laminating an adhesive layer with a removable liner onto the wavelength conversion layer on the surface opposite to the protection layer. In some embodiments, the method comprises the steps of a) forming a wavelength conversion layer and b) laminating an adhesive layer with a removable liner onto the wavelength conversion layer.

Figure 2:
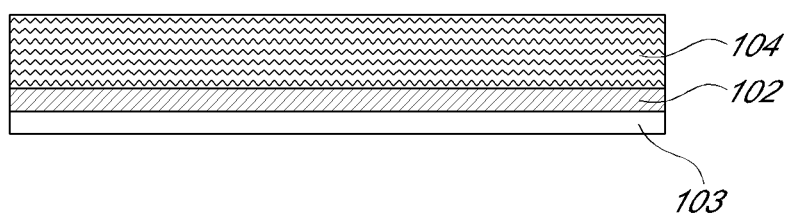
FIG. 2 illustrates an embodiment of a wavelength conversion film comprising a wavelength conversion layer, an adhesive layer, and a removable liner.

In some embodiments as shown in FIG. 1, the wavelength conversion film 10 comprises a protective layer 100, a wavelength conversion layer 101, an adhesive layer 102, and a removable liner 103. In some embodiments as shown in FIG. 2, the wavelength conversion film 11 comprises a wavelength conversion layer 104, an adhesive layer 102, and a removable liner 103.

Figure 3A:
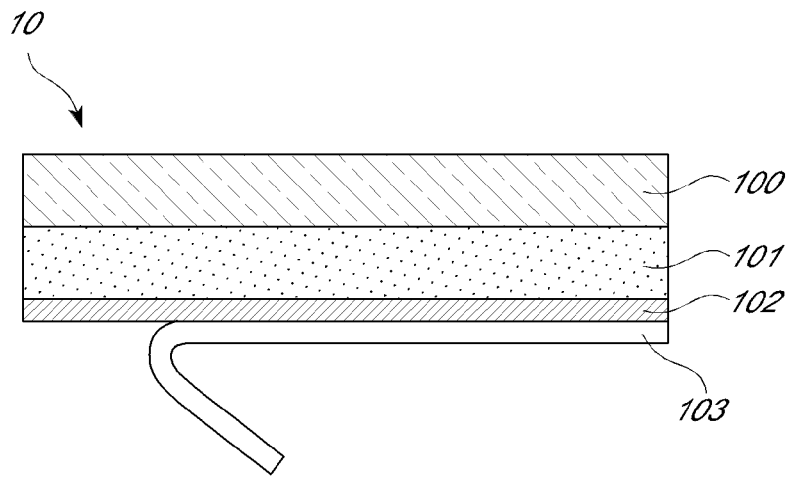
FIGS. 3A, 3B, and 3C illustrate an embodiment of a wavelength conversion film being applied to a solar module.
Figure 3B:
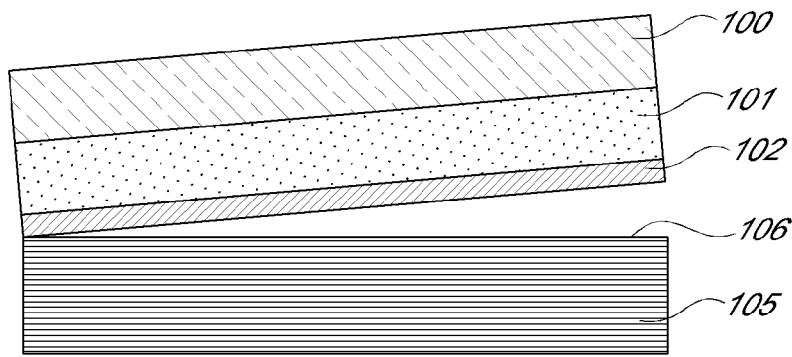
Figure 3C:
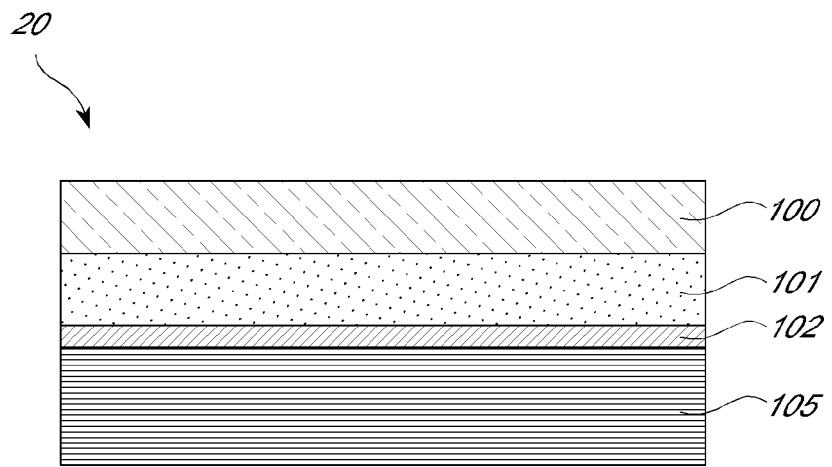

As shown in FIG. 3A, the wavelength conversion film 10 that comprises a protective layer 100, a wavelength conversion layer 101, an adhesive layer 102, and a removable liner 103 can be applied to a solar panel by first removing the liner 103 and exposing the adhesive layer 102. As shown in FIG. 3B, the adhesive layer 102 can then be applied against the light incident surface 106 of the solar panel 105 to adhere the wavelength conversion film to the solar panel 105. As shown in FIG. 3C, this forms a solar panel 20 having improved solar harvesting efficiency. In some embodiments, the protective layer 100 shown in FIGS. 3A-3C is not required and is optionally present.

Figure 4:
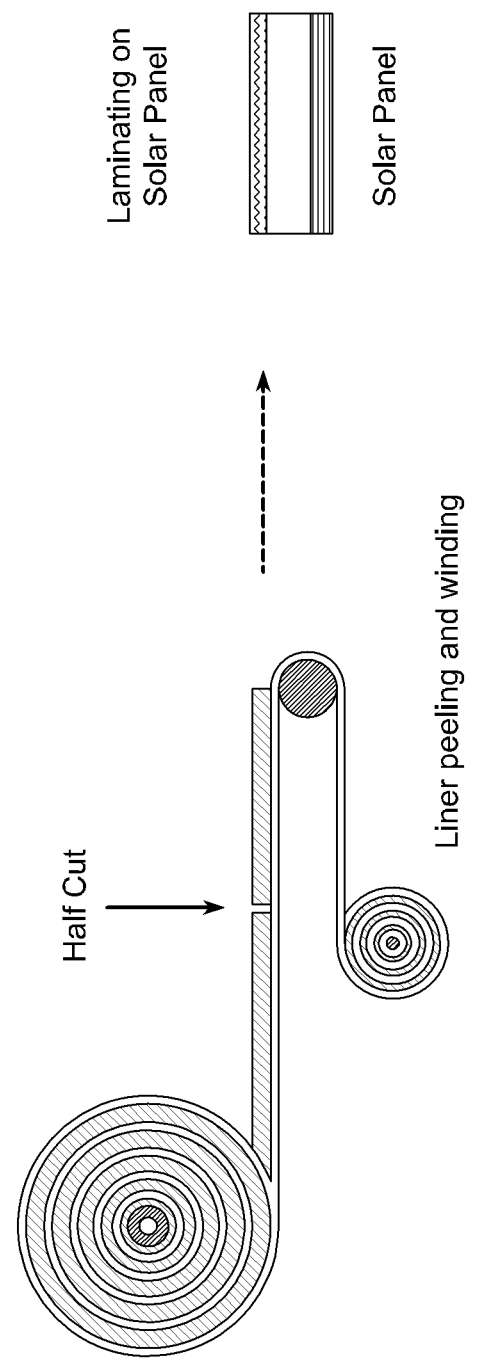
FIG. 4 illustrates an embodiment of the application of a wavelength conversion film onto a rigid solar panel using a roll laminator.
Figure 5:
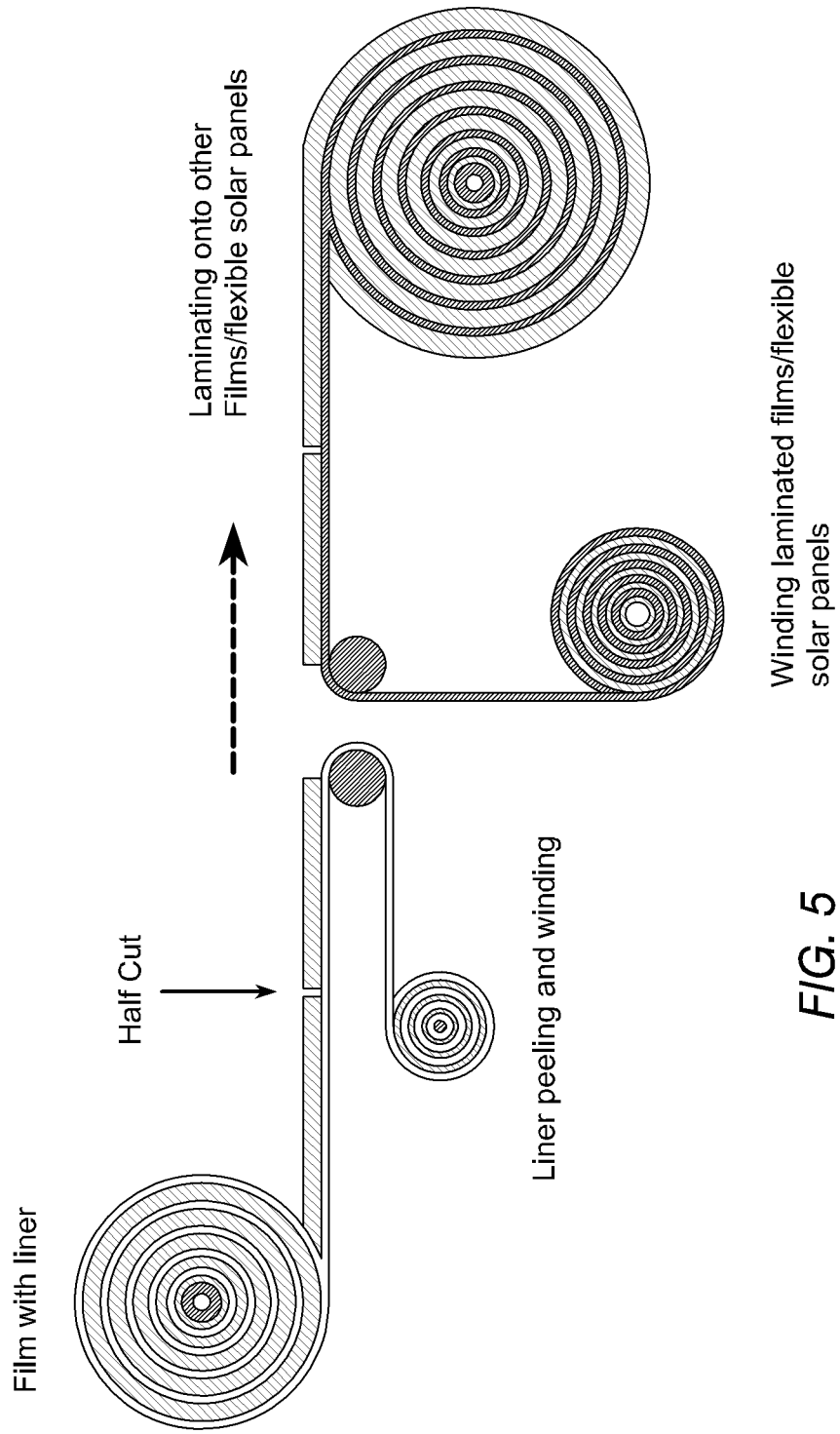
FIG. 5 illustrates an embodiment of the application of a wavelength conversion film onto flexible solar panels using a roll laminator.

As shown in FIG. 4, the wavelength conversion film can be applied to a rigid solar panel using a roll laminator to peel away the liner and unroll the film, and then press the film onto the solar panel. As shown in FIG. 5, the wavelength conversion film can be applied to a flexible solar panel device using a roll laminator to peel away the liner and unroll the film, and then press the film onto the solar panel.

Synthetic methods for the pressure sensitive adhesive type of wavelength conversion film are not restricted, but may follow the example synthetic procedures described as Scheme 1-2 detailed below.

Scheme 1: Wet Processing General Procedure for Forming a Wavelength Conversion Film The wavelength conversion film can be fabricated into a film structure using a wet processing technique. The wavelength conversion layer is fabricated by (i) preparing a polymer solution with dissolved polymer powder in a solvent such as tetrachloroethylene (TCE), cyclopentanone, dioxane, etc., at a predetermined ratio; (ii) preparing a chromophore solution containing a polymer mixture by mixing the polymer solution with the chromophore at a predetermined weight ratio to obtain a chromophore-containing polymer solution, (iii) forming the chromophore/polymer layer by directly casting the chromophore-containing polymer solution onto a glass substrate, then heat treating the substrate from room temperature up to 100° C. in 2 hours, completely removing the remaining solvent by further vacuum heating at 130° C. overnight, and (iv) peeling off the chromophore/polymer layer under the water and then drying out the free-standing polymer layer before use; (v) the layer thickness can be controlled from about 1 µm to about 1 mm by varying the chromophore/polymer solution concentration and evaporation speed;

Once the wavelength conversion layer is formed a protective layer is optionally formed. The protective layer, when present, is made by an extruder and then laminated onto the wavelength conversion layer by a laminator. Then, an adhesive layer with an optional removable liner is applied to the exposed wavelength conversion layer using a laminator. Films may be rolled similar to a roll of tape.

Scheme 2: Dry Processing General Procedure for Forming a Wavelength Conversion Film In some embodiments, the wavelength conversion film is fabricated by (i) mixing polymer powders or pellets and luminescent dye powders together at a predetermined ratio by a mixer at a certain temperature; (ii) degassing the mixture between 1-8 hours at a certain temperature; (iii) then forming the layer using an extruder; (v) the extruder controls the layer thickness from about 1 µm to about 1 mm.

Once the wavelength conversion layer is formed, a protective layer is optionally formed. The protective layer is made by an extruder and then laminated onto the wavelength conversion layer by a laminator. Then, an adhesive layer with an optional removable liner is applied to the exposed wavelength conversion layer using a laminator. Films may be rolled similar to a roll of tape.

Further aspects, features and advantages of this invention will become apparent from the detailed examples which follow.

EXAMPLES

The following embodiments are not intended to limit the present invention. In the present disclosure, the listed substituent groups include both further substituted and unsubstituted groups unless specified otherwise. Further, in the present disclosure where conditions and/or structures are not specified, the skilled artisan in the art can readily provide such conditions and/or structures, in view of the present disclosure, as a matter of routine experimentation.

Example 1 a) Synthesis of Chromophore Compounds

Intermediate A

Common Intermediate A is synthesized in a two step process.

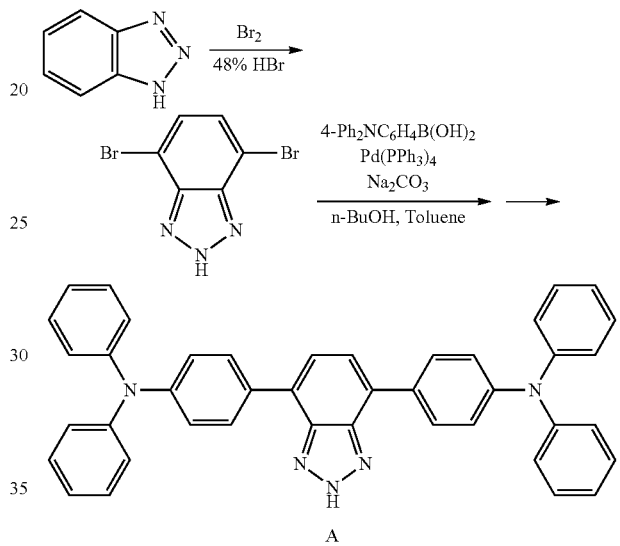

Step 1: Synthesis of 4,7-Dibromo-2H-benzo[d][1,2,3]triazole

A mixture of benzotriazole (5.96 g, 50 mmol), bromine (7.7 mL, 150 mmol) and 48% HBr (30 mL) was heated at 120° C. for 24 hours. The reaction mixture was poured into ice/water (200 mL), neutralized with 5N NaOH, and the excess of bromine was removed by addition of 1 M sodium thiosulfate (test with KI/starch paper). After stirring for 30 minutes, the solid was filtered off, washed with water and dried in a vacuum oven. The crude product was purified by column chromatography (silica gel, dichloromethane/ethyl acetate 75:25) and washing with ethyl acetate (50 mL) to 4,7-dibromo-2H-benzo[d][1,2,3]triazole 2.65 g (19%).

Step 2: Synthesis of Intermediate A—4,7-Bis(4-(N, N-diphenylamino)phenyl)-2H-benzo[d][1,2,3]-triazole A mixture of 4,7-dibromo-2H-benzo[d][1,2,3]triazole (1.37 g, 5.5 mmol), 4-(diphenylamino)phenylboronic acid (3.47 g, 12 mmol), sodium carbonate (5.30 g, 50 mmol) in water (10 mL), tetrakis(triphenylphosphine)palladium (0) (1.15 g, 1.0 mmol), n-butanol (80 mL), and toluene (10 mL) was stirred and heated under argon at 120° C. for 4 days. The reaction mixture was poured into water (300 mL), stirred for 15 minutes, and extracted with dichloromethane (2×300 mL). The solution was dried over anhydrous sodium sulfate, the solvent was removed under reduced pressure, and the residue was chromatographed (silica gel, dichloromethane/ethyl acetate 95:5) to give 4,7-bis(4-(N,N-diphenylamino)phenyl)-2H-benzo[d][1,2,3]triazole (Intermediate A), 1.85 g (56%). $^1$H NMR (400 MHz, CDCl$_3$): δ 7.58 (s, 2H, benzotriazole), 7.16-7.23 (m, 16H, p-phenylene and Ph), 7.07 (t, J=7.3, 4H, Ph), 7.02 (bs, 1H, N—H).

Compound 1

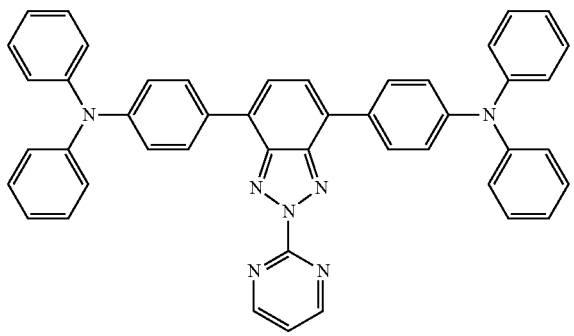

A mixture of Intermediate A (500 mg, 0.82 mmol), 2-chloropyrimidine (343 mg, 3.0 mmol), 60% NaH (60 mg, 1.5 mmol), and dimethylformamide (10 mL) was stirred under argon and heated at 120° C. for 20 hours. The reaction mixture was poured into water (100 mL) and extracted with dichloromethane (4×100 mL). The extract was dried over anhydrous sodium sulfate, the volatiles were removed under reduced pressure, and the residue was chromatographed using silica gel and dichloromethane/ethyl acetate (95:5) as an eluent. The obtained product was recrystallized from ethanol to give 4,7-bis(4-(N,N-diphenylamino)phenyl)-2-(pyrimidin-2-yl)-2H-benzo[d][1,2,3]triazole (Compound 1), orange crystals, 340 mg (61%). $^1$H NMR (400 MHz, CDCl$_3$): δ 8.99 (d, J=5.1 Hz, 2H, pyrimidine), 8.02 (d, J=8.8 Hz, 4H, p-phenylene), 7.66 (s, 2H, benzotriazole), 7.47 (t, J=4.8 Hz, 1H, pyrimidine), 7.28 (m, 8H, Ph), 7.21 (d, J=8.4 Hz, 4H, p-phenylene), 7.18 (m, 8H, Ph), 7.05 (tt, J=7.3 and 1.1 Hz, 4H, Ph). UV-vis spectrum (dichloromethane): $\lambda_{max}$=451 nm. Fluorimetry (dichloromethane): $\lambda_{max}$=600 nm.

Compound 2 and 3

A perylene diester derivative, which is a a non-limiting embodiment of the invention as disclosed herein, is synthesized using a two-step process.

Step 1: Synthesis of Diisobutyl 4,10-dibromoperylene-3,9-dicarboxylate

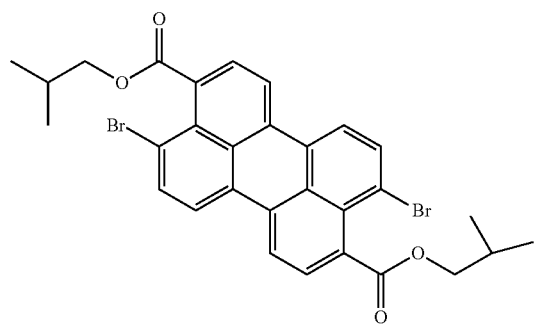

To synthesize diisobutyl 4,10-dibromoperylene-3,9-dicarboxylate ("Compound 2"), N-bromosuccinimide (7.85 g, 44 mol) was added to a solution of perylenedicarboxylic acid diisobutyl ester, which can be purchased from Aldrich Chemical Co. Perylenedicarboxylic diisobutyl ester was also synthesized from the corresponding di-acid derivative by esterification with isobutyl alcohol in DMF (50 ml) under heat at 65° C. for 3 hours (until the initial suspension changes to a clear solution). After cooling, methanol (500 ml) was added to the stirred reaction mixture. Soon heavy precipitate was formed, which was separated by filtration, washed with a small portion of cold methanol, and dried in a vacuum oven to give the above Compound 2 as a yellow solid, pure by $^1$H NMR (9.6 g, 78%).

Step 2: Synthesis of Diisobutyl 4,10-bis(4-(trifluoromethyl)phenyl)perylene-3,9-dicarboxylate

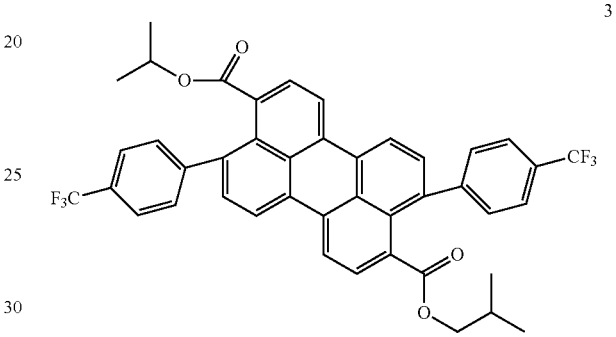

To synthesize diisobutyl 4,10-bis(4-(trifluoromethyl)phenyl)perylene-3,9-dicarboxylate ("Compound 3"), tetrakis(triphenylphosphine)palladium(0) (500 mg, 0.43 mmol) was added to a solution of Compound 2 (3.05 g, 5 mmol), trifluoromethylphenylboronic acid (2.09 g, 11.0 mmol) in a mixture of toluene (50 mL), an aqueous solution of 2M Na$_2$CO$_3$ (20 mL), and ethanol (30 mL) under argon atmosphere. The reaction mixture was heated at 90° C. for 1 hour (until clear separation of the organic, water, and solid was observed). The organic layer was separated, filtered through Celite to remove the palladium catalyst, then the solvent was partially removed under vacuum. The product was precipitated from methanol, filtrated off, washed with cold methanol, and dried in a vacuum oven to give pure Compound 3 (by $^1$H NMR) as a yellow solid (3.30 g, 89%). Alternative purification was performed by column chromatography (silica gel and a mixture of hexane-ethyl acetate 4:1 as mobile phase).

b) Wet Process Synthesis of Wavelength Conversion Film

The wavelength conversion film, which comprises a protective layer 100, a wavelength conversion layer 101, an adhesive layer 102, and a removable liner, as illustrated in FIG. 1, is fabricated into a film structure. First, a wavelength conversion layer is fabricated by (i) preparing a Polyvinyl butyral (PVB) polymer solution by dissolving a PVB powder (from Aldrich and used as received) in TCE (from Aldrich and used as received) at a predetermined ratio of 20 wt %; (ii) preparing a chromophore containing a PVB matrix by mixing the PVB polymer solution with the synthesized Compound 1 (Example 1a) or Compound 3 (Example 1b) at a weight ratio (chromophore compound/PVB) of 0.3 wt % to obtain a chromophore-containing polymer solution; (iii) forming the chromophore/polymer layer by directly casting the chromophore-containing polymer solution onto a glass substrate, then heat treating the substrate from room temperature up to 100° C. in 2 hours, completely removing the remaining solvent by further vacuum heating at 130° C. overnight; and (iv) peeling off the chromophore/polymer layer under the water and then drying out the free-standing polymer layer; (v) the layer thickness was 250 µm, which was obtained by varying the chromophore/polymer solution concentration and evaporation speed.

Once the wavelength conversion layer is formed a protective layer is formed. The protective layer is made by an extruder and then laminated onto the wavelength conversion layer by a laminator. Then, an adhesive layer with a removable liner is applied to the exposed wavelength conversion layer using a laminator. The wavelength conversion film thickness is about 400 µm.

c) Application of Film to Solar Cell

The film is cut to fit to the light incident surface of a CdS/CdTe solar cell. The removable liner is removed and the exposed adhesive layer is pressed against the light incident active window of the CdS/CdTe cell to adhere the film to the device.

d) Measurement of the Efficiency Enhancement

The solar cell photoelectric conversion efficiency was measured by a Newport 400W full spectrum solar simulator system. The light intensity was adjusted to one sun (AM1.5G) by a 2 cm×2 cm calibrated reference monocrystalline silicon solar cell. Then the I-V characterization of the CdS/CdTe solar cell was performed under the same irradiation and its efficiency is calculated by the Newport software program which is installed in the simulator. After determining the stand alone efficiency of the cell, the efficiency enhancement of the cell with the pressure sensitive adhesive type of wavelength conversion film is measured. The film was cut to the same shape and size of the light incident active window of the CdS/CdTe cell, and applied to the light incident front glass substrate of the CdS/CdTe cell using the method described above.

The efficiency enhancement of the solar cell with the attached film was determined using the following equation:

Efficiency Enhancement=$(\eta_{cell+film}-\eta_{cell})/\eta_{cell}*100\%$

The relative efficiency enhancement for CdTe solar cell is 14.0% for Example 1a containing Compound 1 and 15.2% for Example 1b containing Compound 3.

Example 2

Example 2 followed the same procedure as given in Example 1 steps a-d, except that a dry processing technique was used to fabricate the wavelength conversion layer as defined below.

The wavelength conversion layer is fabricated by (i) mixing PVB (Example 2a) or EVA (Example 2b) powders with Compound 3 in a predetermined ratio of 0.3% in a mixer at 170° C.; (ii) degassing the mixture between 1-8 hours at 150° C.; (iii) then forming the layer using an extruder or hot press at 120° C.; (v) the layer thickness was 250 □m which was controlled by the extruder. Once the wavelength conversion layer is formed a protective layer is formed. The protective layer is made by an extruder and then laminated onto the wavelength conversion layer by a laminator. Then, an adhesive layer with a removable liner is applied to the exposed wavelength conversion layer using a laminator. The wavelength conversion film thickness is about 400 □m.

The relative efficiency enhancement for CdTe solar cell is 15.0% for Example 2a containing PVB and 14.3% for Example 2b containing EVA.

Comparative Example 3

This example followed the same procedure outlined in Example 1 and 2, except that Lumogen F Yellow Y083 (purchased from BASF and used as received), a perylene derivative luminescent dye blend, was used instead of Compound 1 or 3.

The relative efficiency improvement is 11%, 11.2%, and 10% for wet processed PVB, dry processed PVB, and dry processed EVA, respectively.

This invention may be modified in terms of the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:
1. A wavelength conversion film comprising:
a wavelength conversion layer, wherein the wavelength conversion layer comprises a polymer matrix and at least one photostable chromophore; and
an adhesive layer, wherein the adhesive layer comprises a pressure sensitive adhesive, wherein the at least one photostable chromophore is represented by:
(a) formula (Ia):

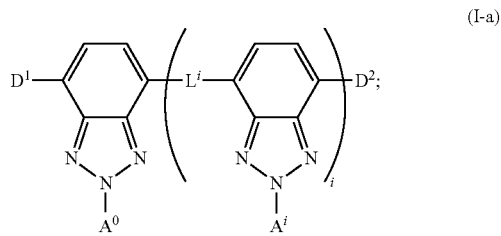

wherein:
i is an integer in the range of 0 to 100;
$A^0$ and $A^1$ are each independently selected from the group consisting of optionally substituted alkyl, optionally substituted alkenyl, optionally substituted heteroalkyl, optionally substituted aryl, optionally substituted heteroaryl, optionally substituted amino, optionally substituted amido, optionally substituted cyclic amido, optionally substituted cyclic imido, optionally substituted alkoxy, and optionally substituted carboxy, and optionally substituted carbonyl;
$D^1$ and $D^2$ are each independently selected from the group consisting of hydrogen, optionally substituted alkoxy, optionally substituted aryloxy, optionally substituted acyloxy, optionally substituted alkyl, substituted aryl, optionally substituted amino, amido, cyclic amido, and cyclic imido, provided that $D^1$ and $D^2$ are not both hydrogen; and
$L^i$ is independently selected from the group consisting of optionally substituted alkylene, optionally substituted alkenylene, optionally substituted alkynylene, optionally substituted arylene, and optionally substituted heteroarylene; or (b) formula (IV):

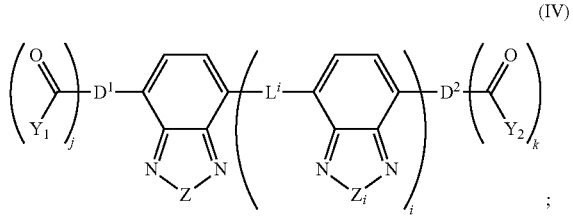

wherein, i is an integer in the range of 0 to 100;

Z and $Z_i$ are each independently selected from the group consisting of $NR^6$, wherein $R^6$ is hydrogen, optionally substituted $C_1$-$C_6$ alkyl, or optionally substituted $C_1$-$C_{10}$ aryl; and $D^1$ and $D^2$ are independently selected from the group consisting of optionally substituted alkoxy, optionally substituted aryloxy, optionally substituted acyloxy, optionally substituted alkyl, optionally substituted aryl, optionally substituted heteroaryl, optionally substituted amino, amido, cyclic amido, and cyclic imido;

j is 0, 1, or 2, and k is 0, 1, or 2, wherein j and k cannot both be 0;

$Y^1$ and $Y^2$ are independently selected from the group consisting of optionally substituted aryl, optionally substituted alkyl, optionally substituted cycloalkyl, optionally substituted alkoxy, and optionally substituted amino; and $L^i$ is independently selected from the group consisting of optionally substituted alkylene, optionally substituted alkenylene, optionally substituted alkynylene, optionally substituted arylene, and optionally substituted heteroarylene.

2. The wavelength conversion film according to claim 1, wherein at least one photostable chromophore is further represented by formula (II-a):

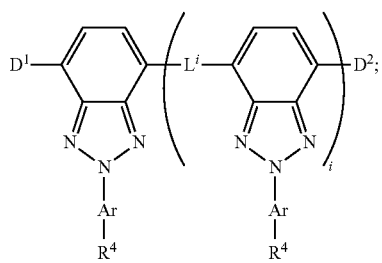

wherein:

i is an integer in the range of 0 to 100;

Ar is optionally substituted aryl or optionally substituted heteroaryl;

$R_4$ is

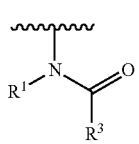

or an optionally substituted cyclic imido;

$R^1$ is each independently selected from the group consisting of H, alkyl, alkenyl, aryl, heteroaryl, aralkyl, and alkaryl;

$R^3$ is each independently selected from the group consisting of optionally substituted alkyl, optionally substituted alkenyl, optionally substituted aryl, and optionally substituted heteroaryl; or R' and R" may be connected together to form a ring;

$D^1$ and $D^2$ are each independently selected from the group consisting of hydrogen, optionally substituted alkoxy, optionally substituted aryloxy, optionally substituted acyloxy, optionally substituted alkyl, substituted aryl, optionally substituted amino, amido, cyclic amido, and cyclic imido, provided that D and D are not both hydrogen; and $L^i$ is independently selected from the group consisting of optionally substituted alkylene, optionally substituted alkenylene, optionally substituted alkynylene, optionally substituted arylene, and optionally substituted heteroarylene.

3. The wavelength conversion film according to claim 1, wherein the at least one photostable chromophore is further represented by formula (III-a):

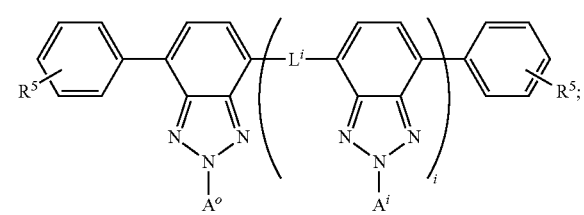

wherein:

i is an integer in the range of 0 to 100;

$A^0$ and $A^i$ are each independently selected from the group consisting of optionally substituted alkyl, optionally substituted alkenyl, optionally substituted heteroalkyl, optionally substituted amido, optionally substituted alkoxy, optionally substituted carbonyl, and optionally substituted carboxy;

each $R^5$ is independently selected from the group consisting of optionally substituted alkyl, optionally substituted alkoxy, optionally substituted aryloxy, optionally substituted acyloxy, and amino;

$L^i$ is independently selected from the group consisting of optionally substituted alkylene, optionally substituted alkenylene, optionally substituted alkynylene, optionally substituted arylene, and optionally substituted heteroarylene.

4. The wavelength conversion film according to claim 1, wherein at least one photostable chromophore is represented by formula (IV):

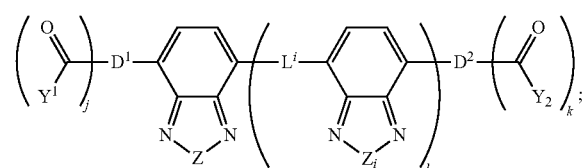

wherein, i is an integer in the range of 0 to 100;

Z and $Z_i$ are each independently selected from the group consisting of $NR^6$, wherein $R^6$ is hydrogen, optionally substituted $C_1$-$C_6$ alkyl, or optionally substituted $C_1$-$C_{10}$ aryl; and D¹ and D² are independently selected from the group consisting of optionally substituted alkoxy, optionally substituted aryloxy, optionally substituted acyloxy, optionally substituted alkyl, optionally substituted aryl, optionally substituted heteroaryl, optionally substituted amino, amido, cyclic amido, and cyclic imido;

j is 0, 1, or 2, and k is 0, 1, or 2, wherein j and k cannot both be 0;

$Y_1$ and $Y_2$ are independently selected from the group consisting of optionally substituted aryl, optionally substituted alkyl, optionally substituted cycloalkyl, optionally substituted alkoxy, and optionally substituted amino; and $L^i$ is independently selected from the group consisting of optionally substituted alkylene, optionally substituted alkenylene, optionally substituted alkynylene, optionally substituted arylene, and optionally substituted heteroarylene.

5. The wavelength conversion film according to claim 1, further comprising a protection layer configured to inhibit penetration of oxygen and moisture into the wavelength conversion layer.

6. The wavelength conversion film according to claim 5, wherein the protection layer comprises a material selected from the group consisting of polyethylene terephthalate, polymethyl methacrylate, polyvinyl butyral, ethylene vinyl acetate, ethylene tetrafluoroethylene, polyimide, amorphous polycarbonate, polystyrene, siloxane sol-gel, polyurethane, polyacrylate, and combinations thereof.

7. The wavelength conversion film according to claim 5, wherein the thickness of the protection layer is in the range of about 50 µm to about 1 mm.

8. The wavelength conversion film according to claim 1, wherein the wavelength conversion layer comprises at least two different photostable chromophores.

9. The wavelength conversion film according to claim 1, wherein at least one photostable chromophore is a down-shifting chromophore.

10. The wavelength conversion film according to claim 1, wherein the wavelength conversion layer comprises a first wavelength conversion sublayer and a second wavelength conversion sublayer, wherein the first wavelength conversion sublayer and the second wavelength conversion sublayer comprise the same or different photostable chromophores.

11. The wavelength conversion film according to claim 1, wherein the polymer matrix of the wavelength conversion layer comprises a material selected from the group consisting of polyethylene terephthalate, polymethyl methacrylate, polyvinyl butyral, ethylene vinyl acetate, ethylene tetrafluoroethylene, polyimide, amorphous polycarbonate, polystyrene, siloxane sol-gel, polyurethane, polyacrylate, and combinations thereof.

12. The wavelength conversion film according to claim 1, wherein the at least one photostable chromophore is present in the polymer matrix of the wavelength conversion layer in an amount of about 0.01 wt % to about 3 wt %, of the polymer matrix.

13. The wavelength conversion film according to claim 1, wherein the thickness of the wavelength conversion film is in the range of about 10 µm to about 2 mm.

14. The wavelength conversion film according to claim 1, wherein the adhesive layer comprises a substance selected from the group consisting of acrylic, ethylene vinyl acetate, polyurethane, and combinations thereof.

15. The wavelength conversion film according to claim 1, wherein the thickness of the adhesive layer is in the range of about 1 µm to about 100 µm.

16. The wavelength conversion film according to claim 1, further comprising a removable liner adjacent to the adhesive layer.

17. The wavelength conversion film according to claim 16, wherein the removable liner comprises a material selected from fluoropolymers or polyethylene terephthalate (PET).

18. The wavelength conversion film according to claim 16, wherein the thickness of the removable liner is in the range of about 10 µm to about 100 µm.

19. The wavelength conversion film according to claim 1, wherein the thickness of the wavelength conversion layer is in the range of about 50 µm to about 1 mm.

20. A method of improving the performance of a solar energy conversion device comprising applying the wavelength conversion film according to claim 1, to the solar energy conversion device, and adhering the adhesive layer to a light incident surface of the solar cell, the solar panel, or the photovoltaic device.

21. The method according to claim 20, wherein the wavelength conversion film is applied to the solar energy conversion device using a roll laminator.

22. The method according to claim 20, wherein the solar energy conversion device is a device selected from the group consisting of a Silicon based device, a III-V or II-VI PN junction device, a Copper-Indium-Gallium-Selenium (CIGS) thin film device, an organic sensitizer device, an organic thin film device, and a Cadmium Sulfide/Cadmium Telluride (CdS/CdTe) thin film device.

23. The method according to claim 20, wherein the solar energy conversion device comprises at least one device selected from the group consisting of an amorphous Silicon solar cell, a microcrystalline Silicon solar cell, and a crystalline Silicon solar cell.

24. The method according to claim 20, wherein the light incident surface of the solar energy conversion device is a material comprising a glass or a polymer.

25. The wavelength conversion film according to claim 3, wherein $R^5$ is a $C_1$-$C_6$ alkyl group.

* * * * *